US009249962B2

United States Patent
Van Bommel et al.

(10) Patent No.: US 9,249,962 B2
(45) Date of Patent: Feb. 2, 2016

(54) ACTIVE COOLING DEVICE WITH ELECTRO-STATICALLY MOVING ELECTRODE AND METHOD OF ACTIVE COOLING WITH ELECTRO-STATICALLY MOVING ELECTRODE

(75) Inventors: Ties Van Bommel, Horst (NL); Leendert Van Der Tempel, Eindhoven (NL); Rifat Ata Mustafa Hikmet, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 227 days.

(21) Appl. No.: 14/126,527

(22) PCT Filed: Jun. 1, 2012

(86) PCT No.: PCT/IB2012/052777
§ 371 (c)(1),
(2), (4) Date: Dec. 16, 2013

(87) PCT Pub. No.: WO2012/176083
PCT Pub. Date: Dec. 27, 2012

(65) Prior Publication Data
US 2014/0119035 A1    May 1, 2014

Related U.S. Application Data

(60) Provisional application No. 61/498,864, filed on Jun. 20, 2011.

(51) Int. Cl.
*F21V 29/02* (2006.01)
*H05K 7/20* (2006.01)
(Continued)

(52) U.S. Cl.
CPC ............. *F21V 29/02* (2013.01); *F21V 29/63* (2015.01); *H01L 33/645* (2013.01); *H02N 1/002* (2013.01);
(Continued)

(58) Field of Classification Search
CPC ..... H05K 7/20145; H02N 1/002; H01L 23/46
See application file for complete search history.

(56) References Cited

U.S. PATENT DOCUMENTS 5,124,879 A   6/1992  Goto
5,488,255 A   1/1996  Sato et al.
(Continued)

FOREIGN PATENT DOCUMENTS

EP   1008885 A1   6/2000
EP   1975505 A1   10/2008
(Continued)

OTHER PUBLICATIONS

Byrnes, H.P., et al.; Technical Disclosure: Electrostatic Fluid Pump; 1968; IP.com Journal; 3 pages.

*Primary Examiner* — Elmito Breval

(57) ABSTRACT

A device (230, 1330, 1430) includes: a first electrode (232); an electro-statically movable second electrode (234, 1734, 1834); and an electrically insulating layer (233) disposed between the first and second electrodes. The electro-statically movable second electrode is configured to have a first geometric configuration in response to a first electrical potential between the first and second electrodes, and is further configured to have a second geometric configuration in response to a second electrical potential between the first and second electrodes. The device is configured to receive a time-varying voltage and in response thereto the electrostatically movable second electrode is configured to repeatedly transition between the first geometric configuration and the second geometric configuration to influence a flow of a fluid (235) for cooling at least one heat-generating element (310).

30 Claims, 18 Drawing Sheets

(51) Int. Cl.
*H02N 1/00* (2006.01)
*H01L 33/64* (2010.01)
*F21V 29/63* (2015.01)
*F21Y 101/02* (2006.01)
*H01L 23/46* (2006.01)
*H01S 5/024* (2006.01)

(52) U.S. Cl.
CPC ......... *H05K 7/20145* (2013.01); *F21Y 2101/02* (2013.01); *H01L 23/46* (2013.01); *H01L 2924/0002* (2013.01); *H01S 5/02407* (2013.01)

(56) References Cited

U.S. PATENT DOCUMENTS

| | | | |
|---|---|---|---|
| 6,252,769 | B1 | 6/2001 | Tullstedt et al. |
| 6,457,654 | B1 | 10/2002 | Glezer et al. |
| 2010/0149719 | A1 | 6/2010 | Ploeg et al. |

FOREIGN PATENT DOCUMENTS

| | | |
|---|---|---|
| WO | 2009072046 A1 | 6/2009 |
| WO | 2010010495 A1 | 1/2010 |
| WO | 2010029485 A1 | 3/2010 |
| WO | 2010035198 A1 | 4/2010 |

ACTIVE COOLING DEVICE WITH ELECTRO-STATICALLY MOVING ELECTRODE AND METHOD OF ACTIVE COOLING WITH ELECTRO-STATICALLY MOVING ELECTRODE

CROSS REFERENCE TO RELATED APPLICATIONS

This application is a national filing of PCT application Serial No. PCT/IB2012/052777, filed Jun. 1, 2012, published as WO 2012/176083 A2 on Dec. 27, 2012, which claims the benefit of and priority to U.S. provisional application Ser. No. 61/498,864 filed Jun. 20, 2011, which is incorporated herein by reference.

TECHNICAL FIELD

The present invention is directed generally to active cooling devices and methods. More particularly, various inventive methods and apparatus disclosed herein relate to devices and methods for actively cooling electrical and electronic devices.

BACKGROUND

Solid state lighting technologies, i.e. illumination based on semiconductor light sources, such as light-emitting diodes (LEDs) and laser diodes, offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications. Some of the fixtures embodying these sources feature a lighting module, including one or more LEDs capable of producing different colors, e.g. red, green, and blue, as well as a processor for independently controlling the output of the LEDs in order to generate a variety of colors and color-changing lighting effects.

In general, light sources including—semiconductor light sources such as LEDs generate heat. There is a persisting need to provide cooling for such light sources, and for various other devices such as other electronics, computers, etc. For this purpose, it is known to provide passive cooling by heat spreaders and/or heat sinks and active cooling by means of fans. However, fans are rather large and heavy, may produce noise, have poor cooling efficiency and have reliability issues. It is also known to provide thermoelectric cooling devices which employ the Peltier effect, or employ synthetic jets or piezoblades, for active cooling. However, with present technology it is not possible to provide a thermoelectric cooling device which can simultaneously have low cost and high power efficiency.

Thus, there is a need in the art for active cooling devices and methods which can overcome one or more of the limitations of current active cooling technologies.

SUMMARY

The present disclosure is directed to inventive methods and apparatus for providing active cooling to electronic devices through the use of one or more electro-statically movable electrodes. For example, the present disclosure reveals embodiments of devices and methods of cooling LED-based lighting sources through the use of one or more electro-statically movable electrodes.

Generally, in one aspect, a lighting unit includes: at least one solid state light source; a cooling device configured to remove heat from the at least one solid state light source, and a controller. The cooling device includes: a first electrode, an electro-statically movable second electrode, and an electrically insulating layer disposed between the first and second electrodes. The electro-statically movable second electrode is configured to have a first geometric configuration in response to a first electrical potential between the first and second electrodes, and is further configured to have a second geometric configuration different from the first geometric configuration in response to a second electrical potential between the first and second electrodes. The controller is configured to apply a time-varying voltage to the cooling device that causes the second electrode to repeatedly transition between the first and second geometric configurations to influence a flow of a fluid which cools the at least one solid state light source.

In one embodiment, the lighting unit further comprises a substrate, wherein the at least one solid state light source is provided at a first side of the substrate, and wherein the cooling device is provided at a second side of the substrate.

In another embodiment, the lighting unit further comprises a third electrode, wherein the electrically insulating layer is disposed between the first electrode and the third electrode, and wherein the controller is further configured to apply a second a time-varying voltage to the cooling device that causes the third electrode to repeatedly transition between the first geometric configuration and the second geometric configuration such that the second and third electrodes work together to influence the flow of the fluid which cools the at least one solid state light source.

In yet another embodiment, the lighting unit further comprises: a first substrate, wherein the at least one solid state light source is provided at a first side of the substrate, and wherein the cooling device is provided at a second side of the substrate; and a second substrate substantially parallel to the first substrate, wherein the fluid is disposed between the first substrate and the second substrate, and wherein the second electrode is configured to influence the fluid to flow in a direction parallel to the first and second substrates in response to the time-varying voltage.

In still another embodiment, the lighting unit further comprises: a first substrate, wherein the at least one solid state light source is provided at a first side of the substrate, and wherein the cooling device is provided at a second side of the substrate; a second substrate substantially parallel to the first substrate, wherein the fluid is disposed between the first and second substrates; and a second cooling device provided at a side of the second substrate that is closest to the first substrate. The second cooling device includes: a third electrode, a fourth electrode, and a second electrically insulating layer disposed between the third and fourth electrodes. The fourth electrode is configured to have the first geometric configuration in response to a third electrical potential between the third and fourth electrodes, and is further configured to have the second geometric configuration in response to a fourth electrical potential between the third and fourth electrodes. The controller is configured to apply a second time-varying voltage to the second cooling device that causes the fourth electrode to repeatedly transition between the first geometric configuration and the second geometric configuration to influence the fluid to flow between the first and second substrates.

In a further embodiment, the lighting unit further comprises: a first substrate, wherein the at least one solid state light source is provided at a first side of the first substrate; and a second substrate substantially parallel to the first substrate, wherein the fluid is disposed between the first and second substrates, wherein the cooling device is provided at a first side of the second substrate that is closest to the first substrate, and wherein the second electrode is configured to influence the fluid to flow in a direction parallel to the first and second substrates in response to the time-varying voltage.

In one optional variation of this embodiment, the second substrate, the first electrode, the second electrode, and the electrically insulating layer are all substantially transparent, and the lighting unit further comprises a diffuser provided at a second side of the second substrate In a yet further embodiment, the at least one solid state light source is provided at a first side of the substrate, and wherein the cooling device is provided inside a tubular structure having a first end proximate the substrate and the at least one solid state light source, and wherein the second electrode is configured to influence the fluid to flow at least in part through the tubular structure.

In a still further embodiment, the lighting unit further comprises third and fourth electrodes, wherein the electrically insulating layer is disposed between the second electrode and the third electrode and between the second electrode and the fourth electrode, and wherein the controller is configured to supply different electrical potentials to the first, third, and fourth electrodes.

In a yet still further embodiment, the first electrode has a gradient in conductivity between a first end and a second end thereof.

In an additional embodiment, the lighting unit further comprises: a structure on which the at least one solid state light source is provided, wherein the structure includes a cavity; and a cartridge having a fluid inlet and a fluid outlet, wherein the cooling device is disposed within the cartridge, and wherein the cartridge is configured to be removably inserted in the cavity of the structure.

In yet another additional embodiment, the at least one solid state light source comprises at least one light emitting diode or laser diode.

In an additional embodiment, the second electrode is a rollable electrode and is configured to be in a rolled-up state in response to the first electrical potential between the first and second electrodes, and is further configured to be unrolled into an unrolled state in response to the second electrical potential between the first and second electrodes, and wherein the time-varying voltage causes the second electrode to repeatedly transition between the rolled-up state and the unrolled state.

In an additional embodiment, the second electrode is a bendable electrode and is configured to be in a bent state in response to the first electrical potential between the first and second electrodes, and is further configured to be moved into a straightened state in response to the second electrical potential between the first and second electrodes, and wherein the time-varying voltage causes the second electrode to repeatedly transition between the bent state and the straightened state.

In an additional embodiment, the lighting unit further comprises: a first substrate, wherein the at least one solid state light source is provided at a first side of the substrate, and wherein the cooling device is provided at a second side of the substrate; and a second substrate substantially parallel to the first substrate and disposed at the second side of the first substrate, wherein the fluid is disposed between the first substrate and the second substrate, wherein the cooling device is disposed on a first side of the second substrate that is located closest to the first substrate, and wherein the electro-statically movable second electrode is a rolling wave electrode.

In another additional embodiment, the cooling device further comprises: a third electrode; an electro-statically movable fourth electrode; and a second electrically insulating layer disposed between the third and fourth electrodes, wherein the electro-statically movable fourth electrode is configured to have the first geometric configuration in response to a third electrical potential between the third and fourth electrodes, and is further configured to have the second geometric configuration in response to a fourth electrical potential between the third and fourth electrodes, and wherein the controller is configured to apply a second time-varying voltage to the cooling device that causes the electro-statically movable fourth electrode to repeatedly transition between the first and second geometric configurations to influence the flow of the fluid which cools the at least one solid state light source.

Generally, in another aspect, a method includes providing a cooling device in a vicinity of at least one heat-generating element, and applying a time-varying voltage to the cooling device. The cooling device includes: a first electrode, a second electrode, and an electrically insulating layer disposed between the first and second electrodes, wherein the second electrode is biased to have a first geometric configuration, and configured to be transitioned to a second geometric configuration in response to an electrical potential applied between the first and second electrodes. The time-varying voltage causes the second electrode to repeatedly transition between the first geometric configuration and the second geometric configuration to influence a flow of a fluid which cools the at least one heat-generating element.

In one embodiment, applying the time-varying voltage comprises applying a periodic voltage.

In another embodiment, the second electrode is a rollable electrode and is biased to remain in a rolled-up state, and is further configured to be unrolled into an unrolled state in response to the electrical potential applied between the first and second electrodes.

In yet another embodiment, the second electrode is a bendable electrode and is biased to remain in a bent state in response to the first electrical potential between the first and second electrodes, and is further configured to be moved into a straightened state in response to the electrical potential applied between the first and second electrodes.

In still another embodiment, the second electrode is a rolling wave electrode.

Generally, in yet another aspect, a device comprises: a first electrode; an electro-statically movable second electrode; and an electrically insulating layer disposed between the first and second electrodes. The electro-statically movable second electrode is configured to have a first geometric configuration in response to a first electrical potential between the first and second electrodes, and is further configured to have a second geometric configuration different from the first geometric configuration in response to a second electrical potential between the first and second electrode. The device is configured to receive a time-varying voltage and in response thereto the second electrode is configured to repeatedly transition between the first geometric configuration and the second geometric configuration to influence a flow of a fluid for cooling at least one heat-generating element.

In one embodiment, the device further comprises an electro-statically movable third electrode, wherein the electrically insulating layer is disposed between the first electrode and the third electrode, wherein the electro-statically movable third electrode is configured to have the first geometric configuration in response to a third electrical potential between the first and third electrodes, and is further configured to have the second geometric configuration in response to a fourth electrical potential between the first and third electrodes, and wherein the device is configured to receive a second time-varying and in response thereto the third electrode is configured to repeatedly transition between the first geometric configuration and the second geometric configuration such that the second and third electrodes work together to influence the flow of the fluid for cooling the at least one heat-generating element.

In another embodiment, the device further comprises a first substrate, wherein the first electrode, electrically insulating layer, and the electro-statically movable second electrode are provided at a first side of the substrate; and a second substrate substantially parallel to the first substrate and disposed at the first side of the first substrate, wherein the fluid is disposed between the first substrate and the second substrate, and wherein the second electrode is configured to influence the fluid to flow in a direction parallel to the first and second substrates in response to the time-varying voltage.

In yet another embodiment, the device further comprises a first substrate, wherein the first electrode, electrically insulating layer, and the electro-statically movable second electrode are provided at a first side of the substrate; a second substrate substantially parallel to the first substrate and disposed at the first side of the first substrate, wherein the fluid is disposed between the first and second substrates; a third electrode; an electro-statically movable fourth electrode; and a second electrically insulating layer disposed between the third and fourth electrodes, wherein the third electrode, second electrically insulating layer, and the electro-statically movable fourth electrode are provided at a first side of the second substrate that is closest to the first substrate, wherein the fourth electrode is configured to have a first geometric configuration in response to a third electrical potential between the third and fourth electrodes, and is further configured to have a second geometric configuration in response to a fourth electrical potential between the third and fourth electrodes, and wherein the device is configured to receive a second time-varying and in response thereto the electro-statically movable fourth electrode is configured to repeatedly transition between the first geometric configuration and the second geometric configuration such that the second and fourth electrodes work together to influence the fluid to flow in a direction parallel to the first and second substrates.

In still another embodiment, the device further comprises third and fourth electrodes, wherein the electrically insulating layer is disposed between the second electrode and the third electrode and between the second electrode and the fourth electrode.

In a further embodiment, the device further comprises a cartridge having a fluid inlet and a fluid outlet, wherein the first electrode, electro-statically movable second electrode, and electrically insulating layer are disposed within the cartridge, and wherein the cartridge is configured to be removably inserted in a cavity of a structure.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication, display, and/or illumination. An "illumination source" is a light source that is particularly configured to generate radiation having a sufficient intensity to effectively illuminate an interior or exterior space. In this context, "sufficient intensity" refers to sufficient radiant power in the visible spectrum generated in the space or environment (the unit "lumens" often is employed to represent the total light output from a light source in all directions, in terms of radiant power or "luminous flux") to provide ambient illumination (i.e., light that may be perceived indirectly and that may be, for example, reflected off of one or more of a variety of intervening surfaces before being perceived in whole or in part).

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

As used herein for purposes of the present disclosure, the term "solid state light source" should be understood to refer to light sources which generate light based on light emitted by solid-state electroluminescence, as opposed to incandescent bulbs (which use thermal radiation) or fluorescent tubes.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "lighting fixture" is used herein to refer to an implementation or arrangement of one or more lighting units in a particular form factor, assembly, or package.

The term "controller" is used herein generally to describe various apparatus relating to the operation or control of one or more other apparatus or components. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

More generally, Applicants have recognized and appreciated that it would be beneficial to provide an active cooling device which can be employed for cooling heat-generating elements, particularly electronic components such as solid state light sources, which is relatively small, quiet, inexpensive, and, reliable. Applicants realize that it is hard and essential to remove or perturb the boundary layer next to the hot surface for efficient cooling and that it is therefore desirable to provide a device and method of removing this boundary layer.

In view of the foregoing, various embodiments and implementations of the present invention are directed to a device, including for example a lighting unit, which includes a cooling device which employs one or more electro-statically movable electrodes to move a fluid in a vicinity of a heat-generating element to cool the heat-generating element. In response to a change in an applied voltage, the electro-statically movable electrode(s) may transition from a first geometric shape or configuration to a second geometric shape or configuration, and in the process to cause movement in a fluid medium that can provide cooling to the heat-generating element. In various embodiments as described in greater detail below, the electro-statically movable electrode(s) may be a rollable or unfurlable electrode, a bendable electrode, or a generalized oscillating electrode.

Figure 1A:
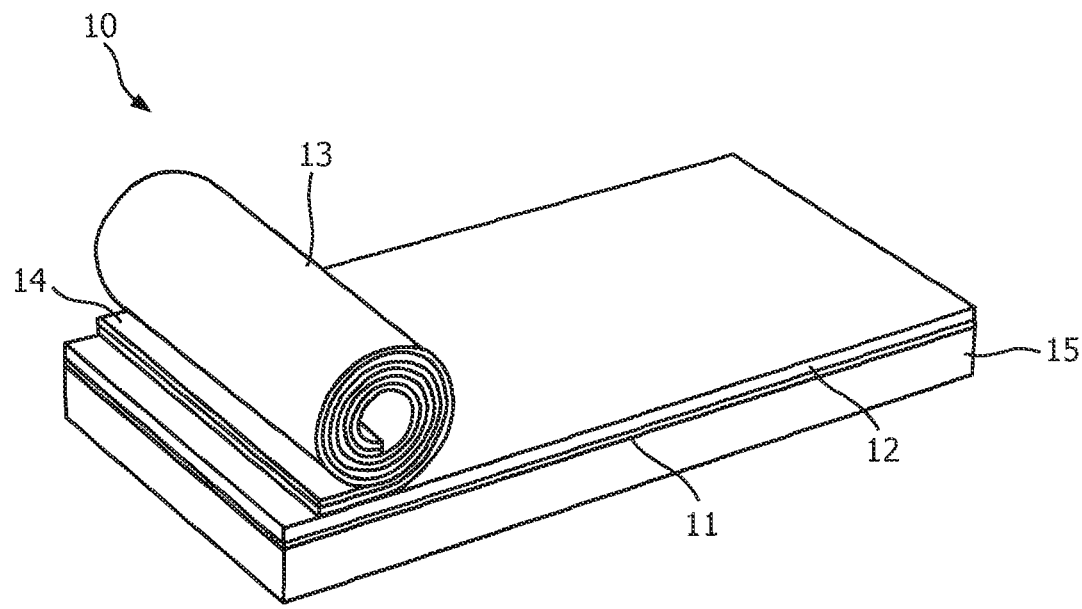
FIGS. 1A-B illustrate one embodiment of a device including an electro-statically movable electrode, in particular a rollable or unfurlable electrode.
Figure 1B:
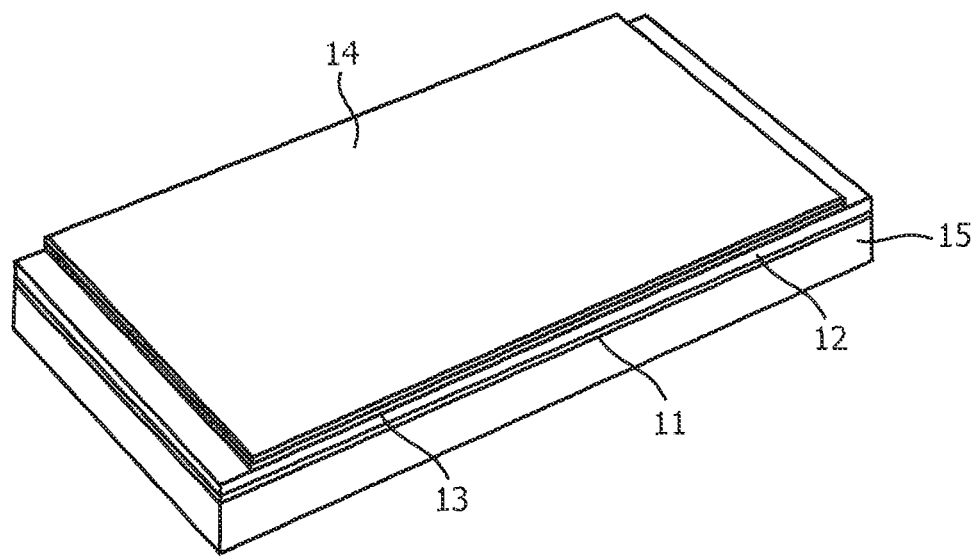

FIGS. 1A-B illustrate one embodiment of a device 10 including an electro-statically movable electrode. Device 10 comprises a first electrode 11, here arranged on a substrate 15, an electrically insulating layer (e.g., a dielectric layer) 12, and a second electrode 13. In the embodiment illustrated in FIGS. 1A-B, second electrode 13 has a multiple layer structure, including a dielectric material layer 14 having an electrically conductive (e.g., metal) layer provided thereon.

FIGS. 1A-B illustrate a specific example of a device with an electro-statically movable electrode where the second electrode 13 is a rollable or unfurlable electrode that is configured to be rolled and unrolled, for example in a periodic fashion, in response to a voltage waveform applied between first and second electrode 11 and 13.

In FIG. 1A, second electrode 13 has a first geometric shape or configuration, and in particular is biased in a rolled-up state, when no potential or voltage difference is applied between first and second electrodes 11 and 13. In FIG. 1B second electrode 13 has a second geometric shape or configuration, and in particular is in an unrolled or unfurled state, in response to a sufficient potential or voltage difference being applied between first and second electrodes 11 and 13.

It may be assumed that three (or four) forces determine the behavior of the rollable second electrode 13, which forces are the elastic force, and the electrostatic force, but also the "van der Waals" force and to a minor extend the gravitational force. The elastic force may be a result of e.g. shrinkage during manufacturing. By applying a voltage between or across first electrode 11 and second electrode 13, an electrostatic force directed to unroll or unfurl second electrode 13 and keep it in the unrolled state, is obtained. The elastic force acts on second electrode 13 even when there is no electric field present, and is directed at rollable it up. The electrostatic force is the attractive force between first and second electrodes 11 and 13 by applying a voltage. The "van der Waals" force is the force between the dielectric material 14 and the dielectric material 12. This force depends on the distance between the two media, the roughness of the media and the material properties; the smaller distance the larger "van der Waals" force. The gravitational force acts upon second electrode 13 which also depends on its orientation. In general, second electrode 13 may be very thin and therefore have a very low mass, and accordingly the gravitational force may be negligible.

To unroll or unfurl second electrode 13, and for second electrode 13 to stay in its unrolled state, the elastic force always acting on second electrode 13, directed at rolling it up, must be overcome. For this purpose, a sufficient electrostatic force obtained by applying an adequate voltage between first electrode 11 and second electrode 13 must be generated. In order to return second electrode 13 to its rolled up state the voltage is switched off, resulting in no electrostatic force acting on rollable second electrode 13. The elastic force causes second electrode 13 to roll up under the condition that this force is greater than the "van der Waals" force.

In some embodiments, first and second electrodes 11 and 13 may be transparent electrodes, such as indium tin oxide (ITO) electrodes, for reducing optical transmission losses. Second electrode 13 may further comprise linear indentations in order to remove parts of the second electrode layer if it is relatively thick and hence require a higher voltage to be unrolled.

The present inventors have discovered that if an appropriate time-varying voltage (e.g., a periodic voltage) is applied between the first and second electrodes 11 and 13 of device 10 to cause second electrode 13 to repeatedly transition between the rolled-up state and the unrolled state, then second electrode 13 may influence or cause a flow of a fluid (e.g., air) which may provide active cooling to one or more heat-generating elements.

Typical displacement of a fluid (e.g., air) by the rolling and unrolling action of second electrode 13 can be estimated as the product of: (roll velocity of second electrode 13)*(diameter of second electrode 13)*(length of second electrode 13 when unrolled or unfurled). For example, in one embodiment, the velocity may be 0.1 m/s, the width of second electrode 13 may be 0.005 m, and the length of second electrode 13 may be 0.1 m. In that case, the rolling and unrolling action of second electrode 13 may provide a fluid (e.g., air) displacement rate of 0.00005 m$^3$/s≈0.2 m$^3$/h. In the example illustrated above, it is noted that the velocity is 0.1/ms and the length is 0.1 m. So in that case, a periodic voltage (e.g., a square wave voltage) having a rate of 1 Hz may be applied between first and second electrodes 11 and 13.

Figure 2A:
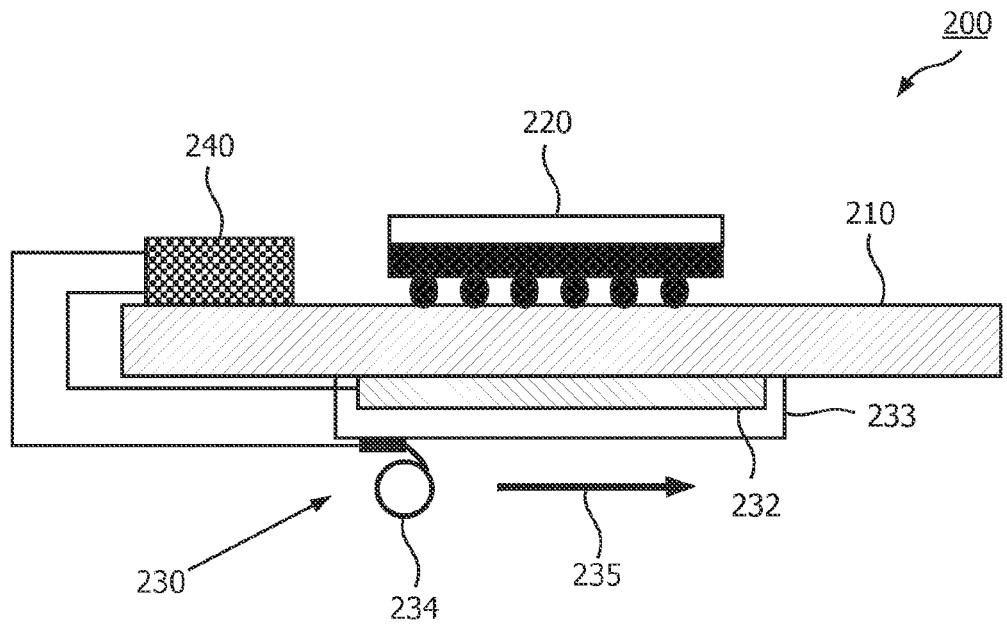
FIGS. 2A-B illustrate one embodiment of a lighting unit including a cooling device with a rollable electrode.
Figure 2B:
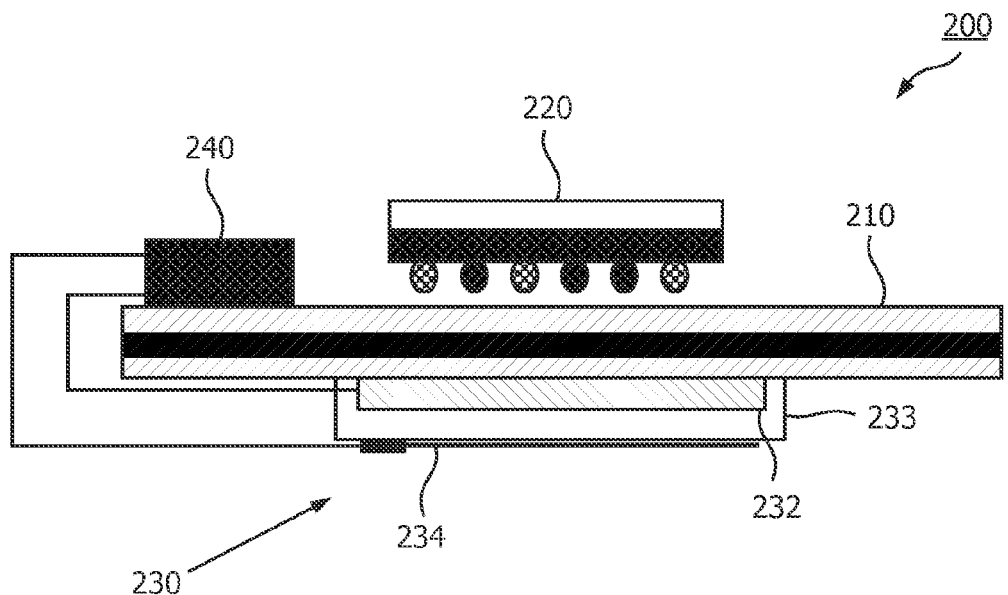

FIGS. 2A-B illustrate one embodiment of a lighting unit 200 including a cooling device 230 with a rollable second electrode 234. Lighting unit 200 includes: a substrate 210; one or more solid state light sources 220 disposed at a first side of substrate 210; a cooling device 230 disposed at a second side of substrate 210; and a controller 240.

Solid state light source(s) 220 may comprise one or more light emitting diodes (LEDs), laser diodes, light emitting polymers, organic light emitting diodes (OLEDs), electroluminescent strips, etc. Solid state light source(s) 220 may include various types of infrared LEDs, ultraviolet LEDs, red LEDs, blue LEDs, green LEDs, yellow LEDs, amber LEDs, orange LEDs, white LEDs, and combinations of any of the above.

Cooling device 230 includes a first electrode 232 and a second electrode 234 with an electrically insulating later 233 (e.g., a dielectric layer) disposed therebetween. As shown in FIG. 2A, second electrode 234 is configured to be in a rolled-up state in response to a first electrical potential (e.g., zero volts) applied between first and second electrodes 232 and 234, and as shown in FIG. 2B, second electrode 234 is further configured to be unrolled into an unfurled or unrolled state in response to a second electrical potential applied between first and second electrodes 232 and 234.

Controller 240 is connected to provide or apply an output voltage across or between first electrode 232 and second electrode 234. Although it is illustrated in FIGS. 2A-B that controller 240 is connected to both first electrode 232 and second electrode 234, in alternative embodiments one of first electrode 232 and second electrode 234 may be connected to a fixed voltage, and controller 240 may provide a voltage to the other of first electrode 232 and second electrode 234. For example, in some embodiments first electrode 232 may be connected to ground, and controller may be configured to apply a voltage to second electrode 234. Although controller 240 is shown in FIGS. 2A-B as being disposed on substrate 210, in other embodiments controller 240 may be disposed in any other convenient location. Furthermore, in some embodiments controller 240 may not be a dedicated controller for only controlling operations of cooling device 230, but may be a multifunctional device that controls a variety of functions for lighting unit 200, including, for example, operation of solid state light source(s) 220.

Beneficially, controller 240 may be configured to apply a time-varying voltage to cooling device 230 that causes second electrode 234 to repeatedly transition between the rolled-up state (FIG. 2A) and the unrolled state (FIG. 2B) to cause or influence a flow of a fluid 235 which cools the at least one solid state light source 220. In some embodiments, controller 240 may be configured to apply a periodic voltage between first electrode 232 and second electrode 234, and particularly a square wave voltage, to cause second electrode 234 to motivate the fluid. In some embodiments, the fluid may comprise air or another convenient gas such as nitrogen or helium, while in other embodiments the fluid may comprise water or another convenient liquid such as a cooling oil, in an open or closed loop configuration.

In some embodiments, controller 240 may also be connected to a sensor. For instance, the sensor may be a temperature sensor measuring the temperature of a device to be cooled (e.g., solid state light source (s) 220) and based on this input controller 240 may output a specific voltage i.e. amplitude, frequency or pattern across or between first electrode 232 and second electrode 234. For example, in one embodiment when a high temperature is measured by a sensor, controller 240 may be configured to increase the frequency of the signal applied across or between first electrode 232 and second electrode 234, which may cause second electrode 234 to roll and unroll at a faster rate, thereby increasing the cooling effect. In another example embodiment, the sensor may be a light sensor measuring the light output of color temperature of light source(s) 220, and in response to the light sensor output controller 240 may provide a time-varying voltage. For example, when a higher lm-output is measured by the light sensor, controller 240 may increase the frequency of the voltage waveform it supplies across or between first electrode 232 and second electrode 234.

In the embodiments described illustrated in the subsequent drawings, the controller is not explicitly shown but it should be understood that the cooling devices in these embodiments are configured to receive a time-varying voltage to cause their movable electrodes to transition between a rolled-up state and an unrolled state, and this time-varying voltage may be provided by a controller such as controller 240 shown in FIGS. 2A-B.

It should be understood that FIGS. 2A-B and the other drawings to be discussed below are not drawn to scale nor should they necessarily be taken as "photographically accurate" representations, but instead should be understood to illustrate for explanation purposes the different elements of the various embodiments. So, for example, while for clarity of illustration the second electrode is drawn in FIGS. 2A-B and other drawings to be described below slightly separated from the electrically insulating layer, in general the second electrode will be in contact with the electrically insulating layer.

Figure 3A:
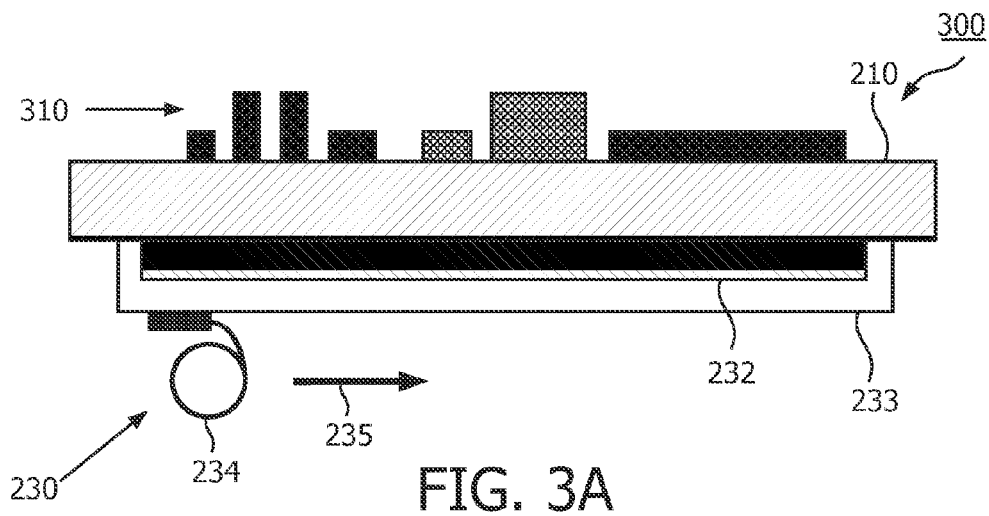
FIGS. 3A-C illustrate a first embodiment of an electronic device including a cooling device with an electro-statically movable electrode, in particular a rollable electrode.
Figure 3B:
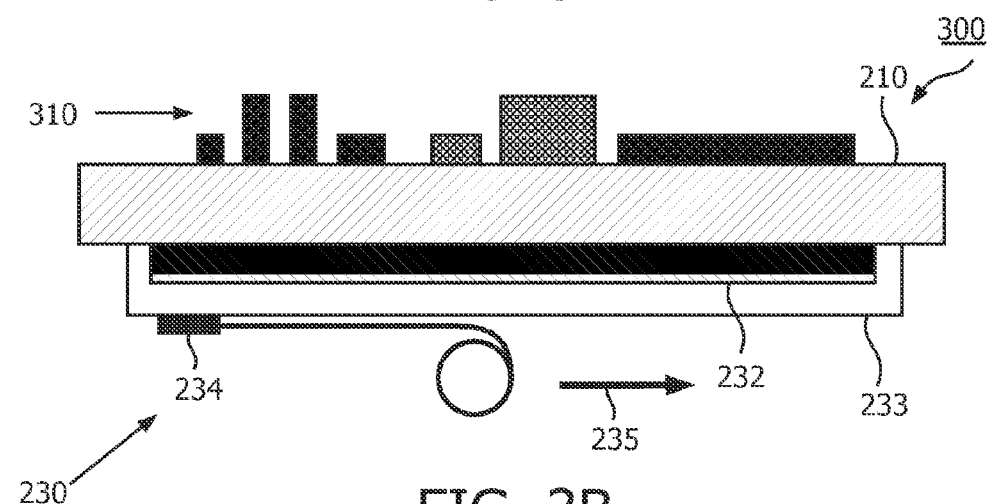
Figure 3C:
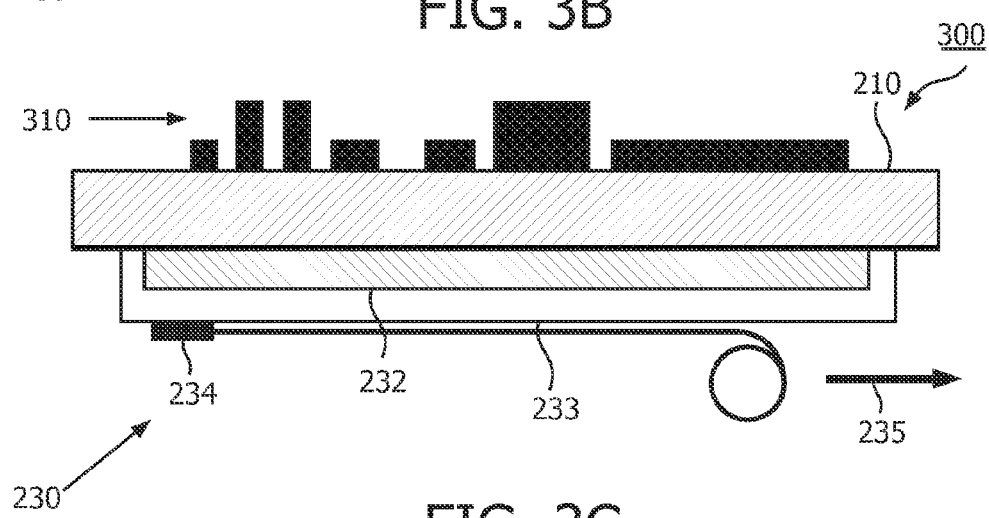

FIGS. 3A-C illustrate a first embodiment of an electronic device 300 including cooling device 230 with rollable second electrode 234. Electronic device 300 includes one or more heat-generating elements 310 at a first side of substrate 210, and cooling device 230 at the opposite second side of substrate 210.

Heat-generating elements 310 may include electronic components such as solid state light sources, processors, amplifiers, etc.

Cooling device 230 is configured, and operates, the same as described above with respect to FIGS. 2A-B and so a description thereof will not be repeated.

Although not shown in FIGS. 3A-C, device 300 may further include a controller such as controller 240 of FIGS. 2A-B for supplying a time-varying voltage to cooling device 230 that causes second electrode 234 to repeatedly transition between the rolled-up state and the unrolled state to influence a flow of a fluid which cools the one or more heat-generating elements 310. In some embodiments, the fluid may comprise air or another convenient gas such as nitrogen or hydrogen, while in other embodiments the fluid may comprise water or another convenient liquid, such as a cooling oil, in an open or closed loop configuration.

In electronic device 300, the heat produced by one or more heat-generating elements 310 to be cooled is conducted through the back side of the elements 310 to substrate 210 which is actively cooled by cooling element 230.

Figure 4A:
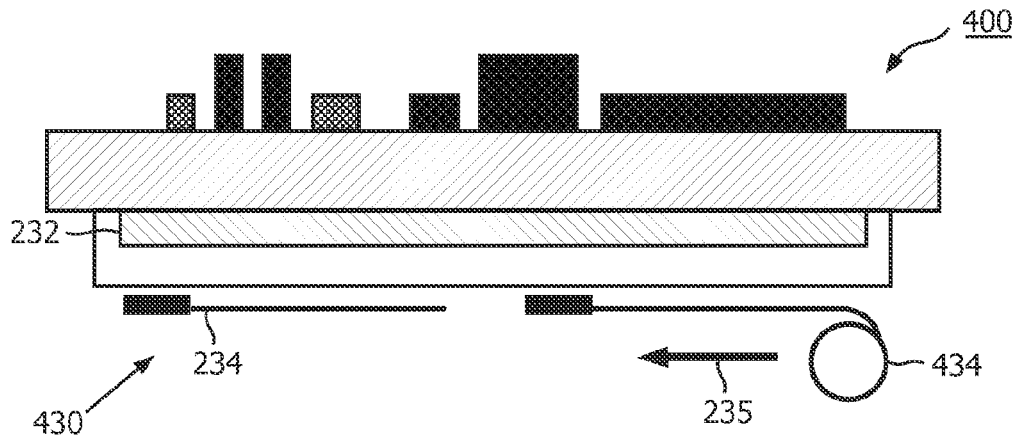
FIGS. 4A-C illustrate a second embodiment of an electronic device including a cooling device with an electro-statically movable electrode, in particular a rollable electrode.
Figure 4B:
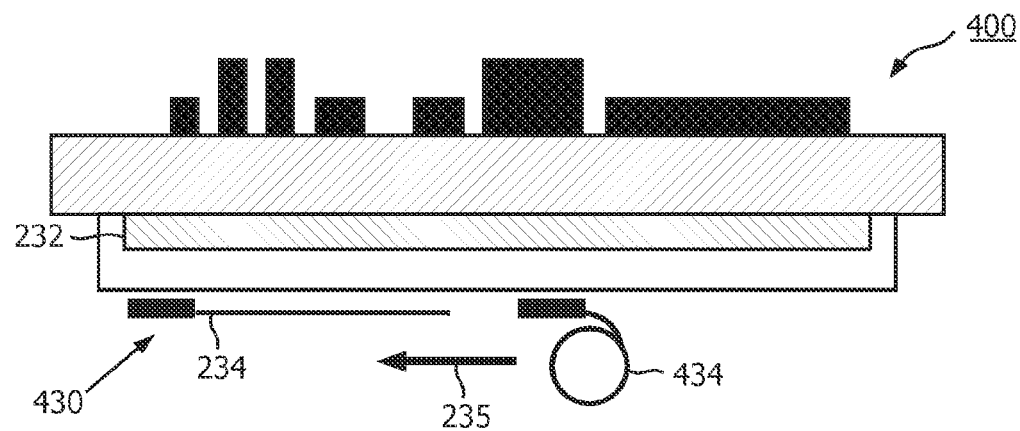
Figure 4C:
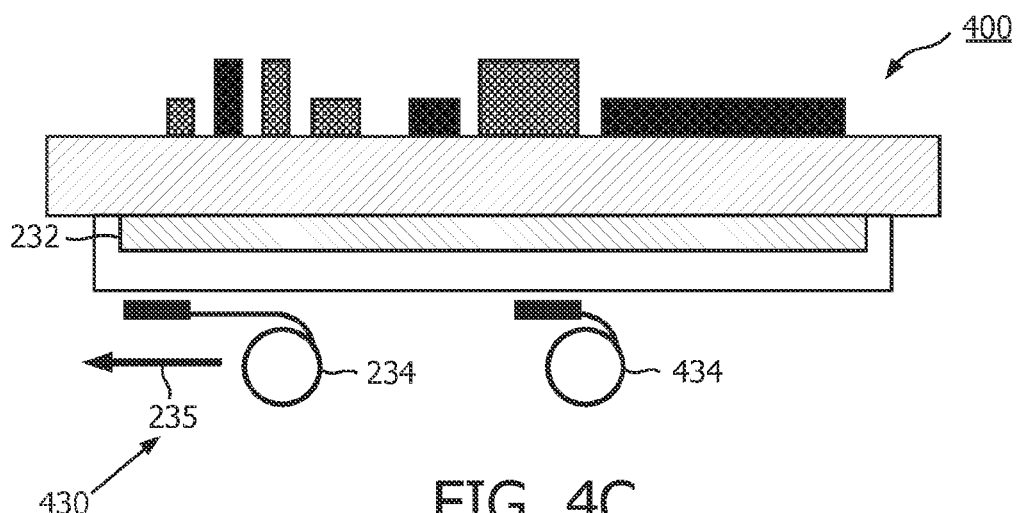

FIGS. 4A-C illustrate a second embodiment of an electronic device 400 including a cooling device 430 with a rollable electrode.

Electronic device 400 is similar in construction and operation to electronic device 300, and only differences therebetween will be described.

Electronic device 400 includes a cooling device 430, which is similar in construction and operation to cooling device 230 as described above, except that cooling device 430 includes a third electrode 434. The electrically insulating layer (e.g., dielectric layer) is disposed between the first electrode and third electrode 434. The controller (not shown in FIGS. 4A-C) is further configured to apply a second a time-varying voltage to cooling device 430, in particular to third electrode 434, that causes third electrode 434 to repeatedly transition between the rolled-up state (FIGS. 4B-C) and the unrolled state (FIG. 4A) such that the second and third electrodes work together to cause or influence the flow of the fluid which cools the one or more heat-generating elements of electronic device 400. Beneficially, second and third electrodes 234 and 434 can be individually controlled, for example by a controller such as controller 240 described above. In some embodiments, second and third electrodes 234 and 434 are individually controlled by applying different voltage waveforms to second and third electrodes 234 and 434.

In other embodiments, second and third electrodes 234 and 434 are connected together and receive the same voltage waveform from the controller, but may unroll at different voltages than each other, for example because second and third electrodes 234 and 434 are made of different materials than each other, or have different thicknesses.

In still other embodiments, first electrode 232 may be replaced with two separate electrodes corresponding to second and third electrodes 234 and 434, perhaps with separate insulating layers, such that there are two separate pairs of electrodes each driven with its own corresponding voltage difference provide by a controller such as controller 240.

In yet other embodiments, the cooling device may include more than two electro-statically movable (e.g., rollable) electrodes or electrode pairs which may be all driven individually.

Figure 5A:
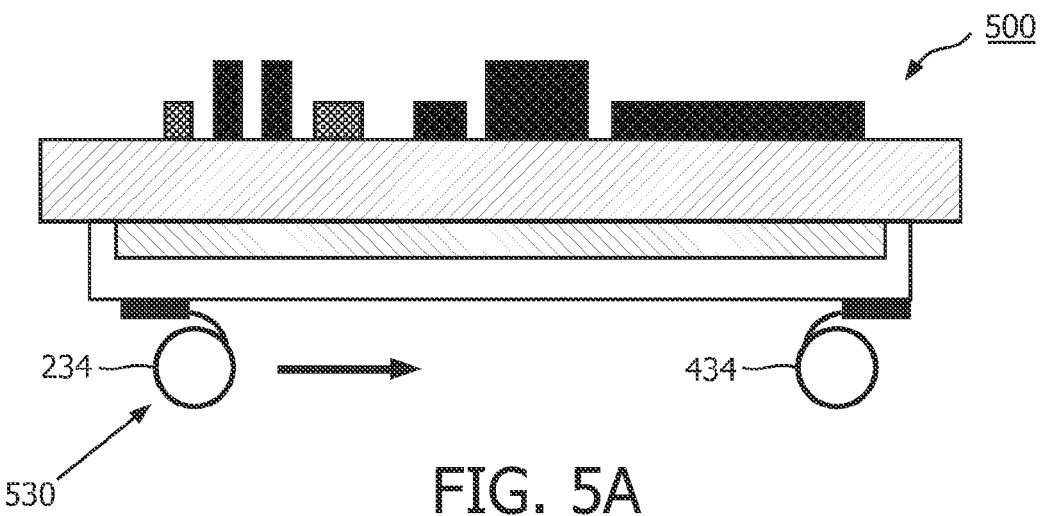
FIGS. 5A-C illustrate a third embodiment of an electronic device including a cooling device with an electro-statically movable electrode, in particular a rollable electrode.
Figure 5B:
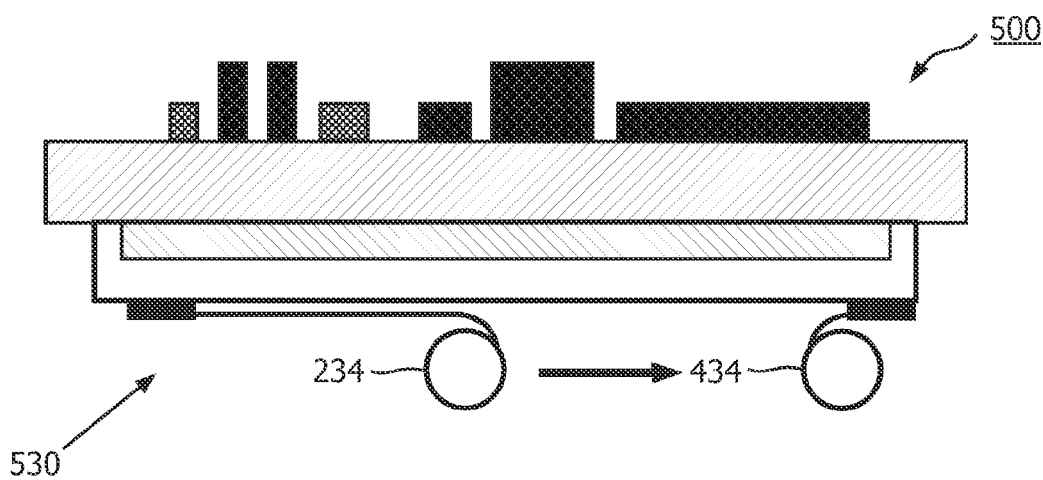
Figure 5C:
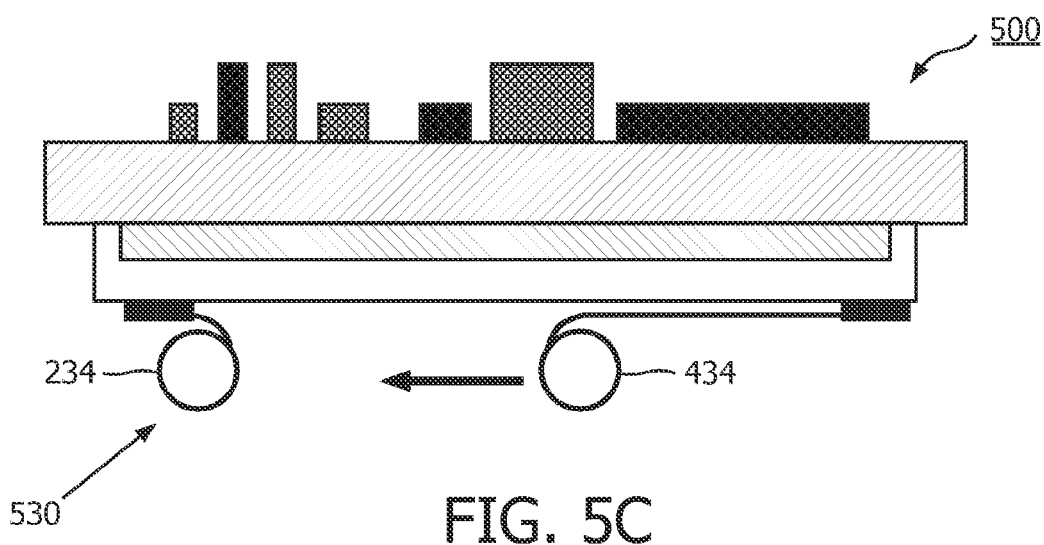

FIGS. 5A-C illustrate a third embodiment of an electronic device 500 including a cooling device 530 with a rollable electrode.

Electronic device 500 is similar in construction and operation to electronic device 400, and only differences therebetween will be described.

Cooling device 530 is similar in construction and operation to cooling device 430 as described above, except that in cooling device 530, when the second and third electrodes are in the rolled-up state, they are located at opposite ends the cooling device along the direction in which the fluid flows. Cooperation between multiple rolling cooling devices may increase pressure and/or flow and/or a size of a cooling surface.

Figure 6A:
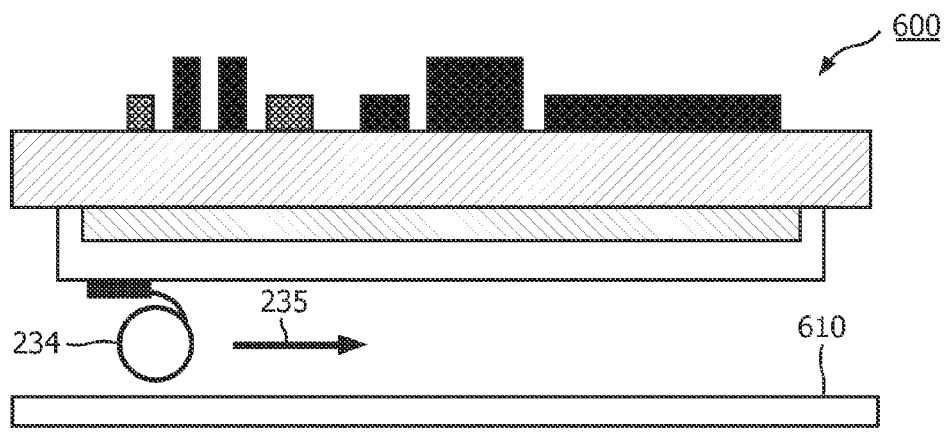
FIGS. 6A-C illustrate a fourth embodiment of an electronic device including a cooling device with an electro-statically movable electrode, in particular a rollable electrode.
Figure 6B:
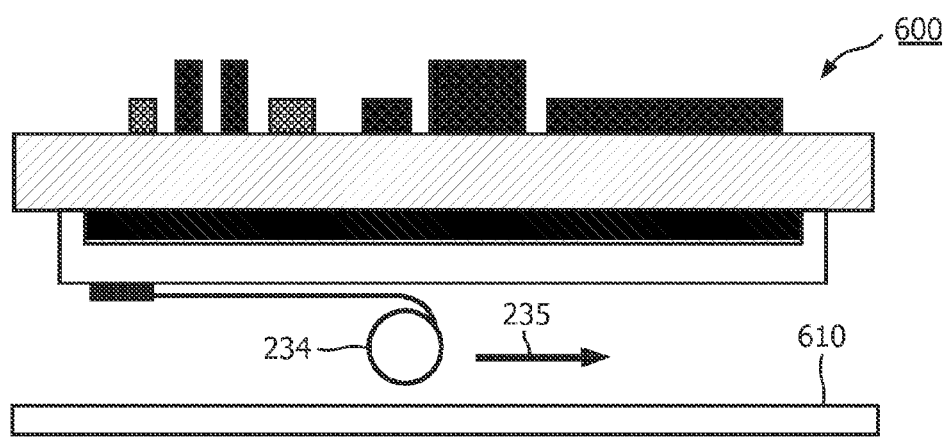
Figure 6C:
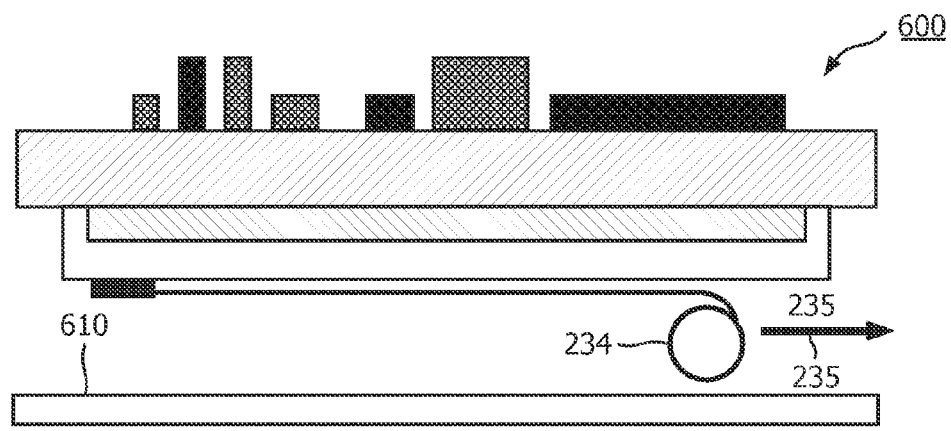

FIGS. 6A-C illustrate a fourth embodiment of an electronic device 600 including a cooling device with a rollable electrode.

Electronic device 600 is similar in construction and operation to electronic device 300, and only differences therebetween will be described.

In electronic device 600, the cooling device including the movable electrode is disposed between a first substrate on which are disposed one or more heat-generating elements to be cooled, and a second substrate 610 substantially parallel to the first substrate, wherein fluid 235 is disposed between first and second substrates 210 and 610. This arrangement may enhance the displacement or flow of fluid 235 by the cooling device.

Figure 7A:
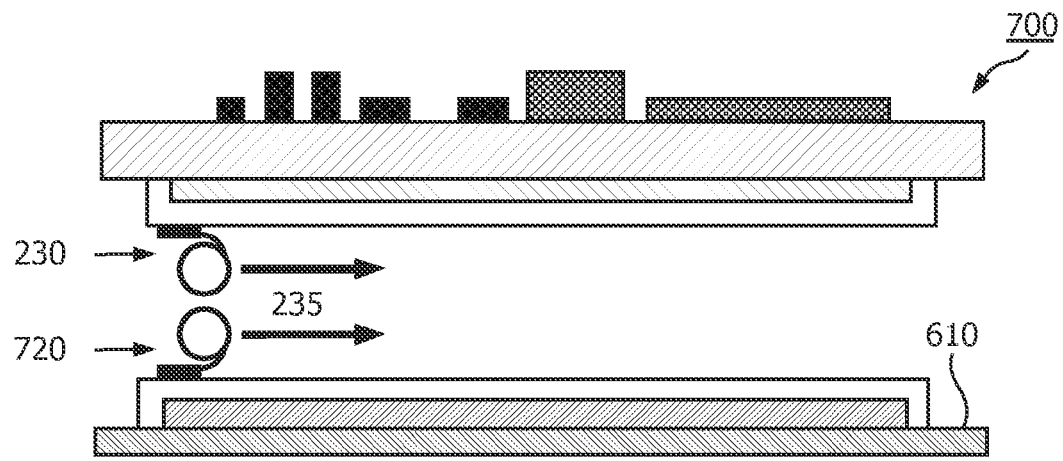
FIGS. 7A-C illustrate a fifth embodiment of an electronic device including a cooling device with an electro-statically movable electrode, in particular a rollable electrode.
Figure 7B:
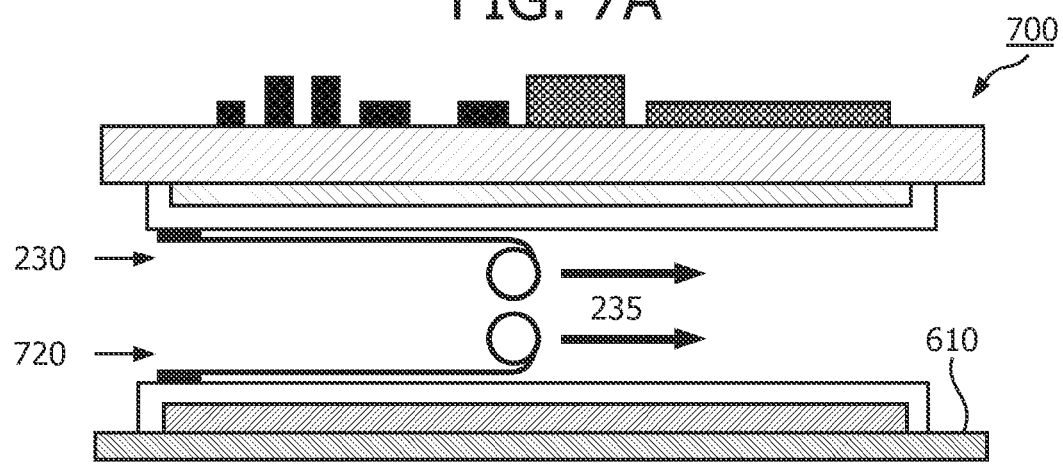
Figure 7C:
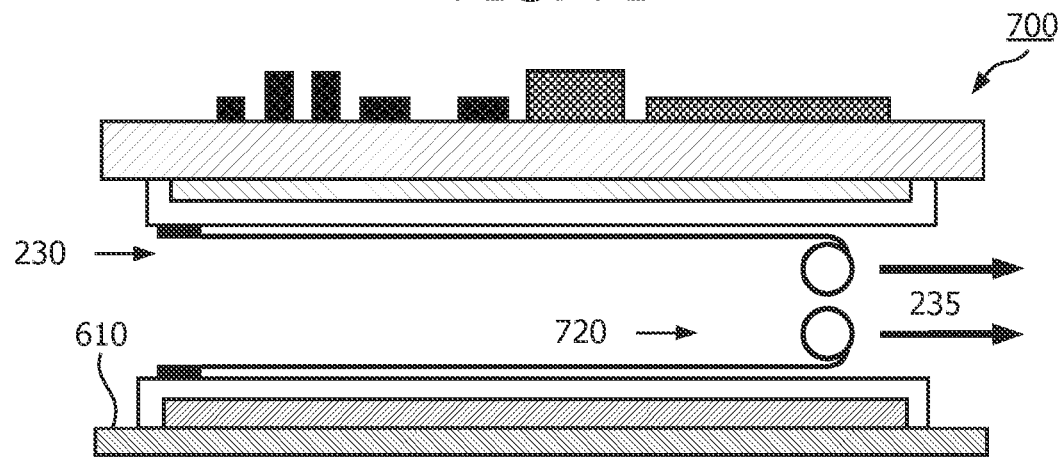

FIGS. 7A-C illustrate a fifth embodiment of an electronic device 700 including a cooling device with a rollable electrode.

Electronic device 700 is similar in construction and operation to electronic device 600, and only differences therebetween will be described.

Electronic device 700 includes first and second cooling devices 230 and 720.

In particular, electronic device 700 includes a second substrate 610 substantially parallel to the first substrate, wherein the fluid is disposed between the first and second substrates, and first and second cooling devices 230 and 720, where second cooling device 720 is provided at a side of second substrate 610 that is closest to the first substrate. Although not labeled, second cooling device 720 includes: a third electrode, a fourth electrode, and a second electrically insulating layer disposed between the third and fourth electrodes. The fourth electrode is configured to be in a rolled-up state in response to a third electrical potential between the third and fourth electrodes, and is further configured to be unrolled into an unrolled state in response to a fourth electrical potential between the third and fourth electrodes. Beneficially, device 700 may further include a controller such as controller 240 of FIGS. 2A-B, wherein the controller is configured to apply a second time-varying voltage to second cooling device 720 that causes the fourth electrode to repeatedly transition between the rolled-up state and the unrolled state to influence the fluid 235 to flow between the first and second substrates 210 and 610.

Figure 8A:
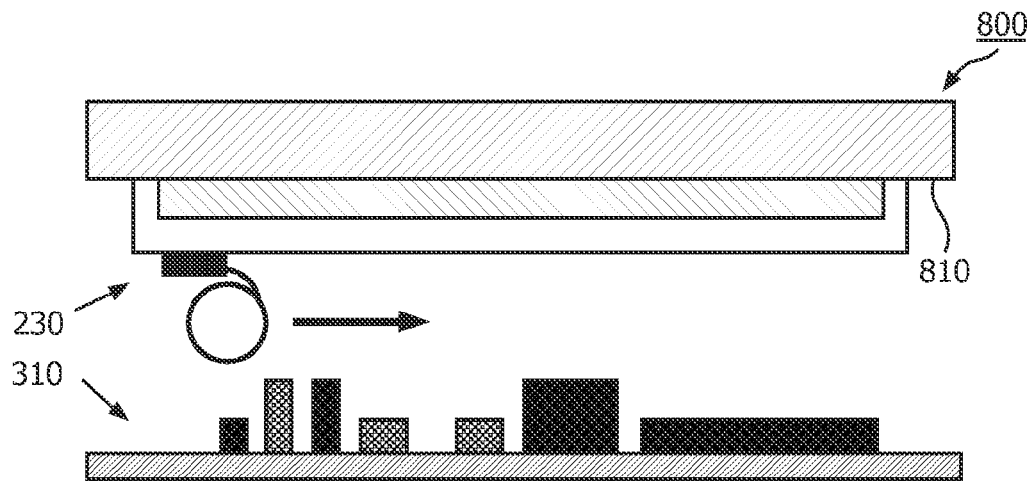
FIGS. 8A-C illustrate a sixth embodiment of an electronic device including a cooling device with an electro-statically movable electrode, in particular a rollable electrode.
Figure 8B:
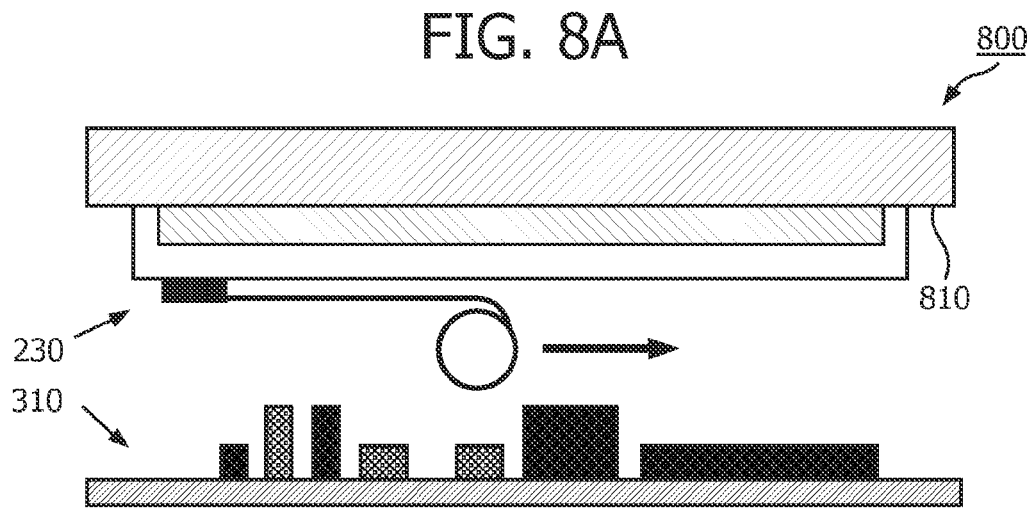
Figure 8C:
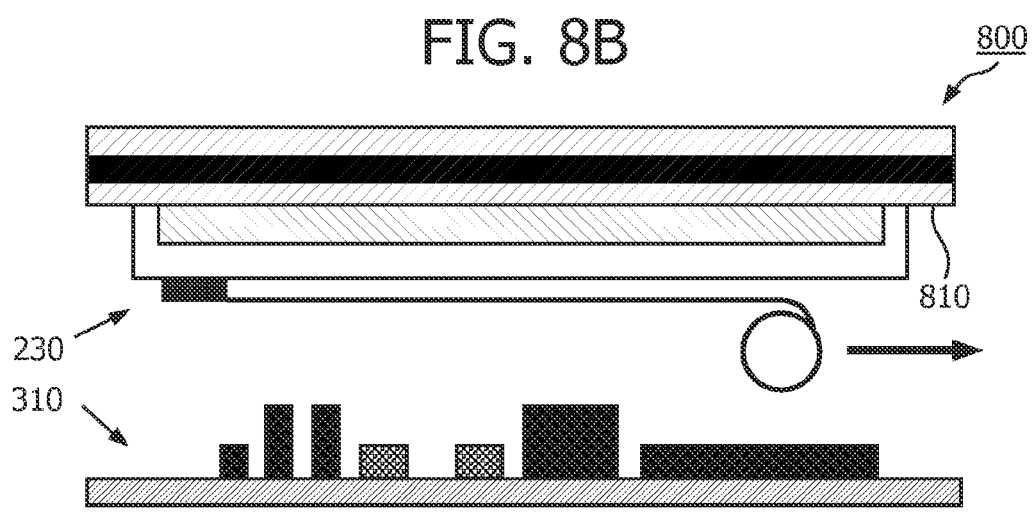

FIGS. 8A-C illustrate a sixth embodiment of an electronic device 800 including a cooling device with a rollable electrode.

In electronic device 800, cooling device 230 is provided on a second substrate 810 which is substantially parallel to the first substrate and positioned on a same side of the first substrate as the heat-generating elements. The fluid whose flow is caused or influenced by cooling device 230 is disposed between the first and second substrates. The second, rollable, electrode of cooling is configured to influence the fluid to flow in a direction parallel to the first and second substrates in response to a time-varying voltage applied from controller (not shown in FIGS. 8A-C).

Figure 9A:
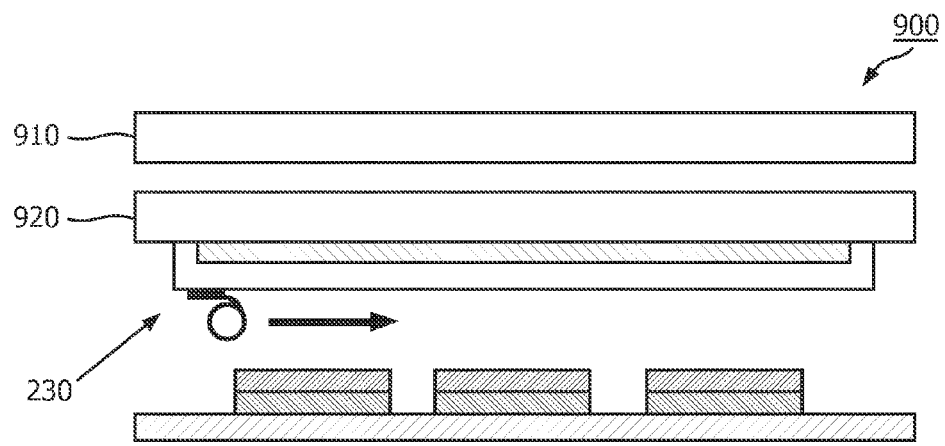
FIGS. 9A-C illustrate a seventh embodiment of an electronic device including a cooling device with an electro-statically movable electrode, in particular a rollable electrode.
Figure 9B:
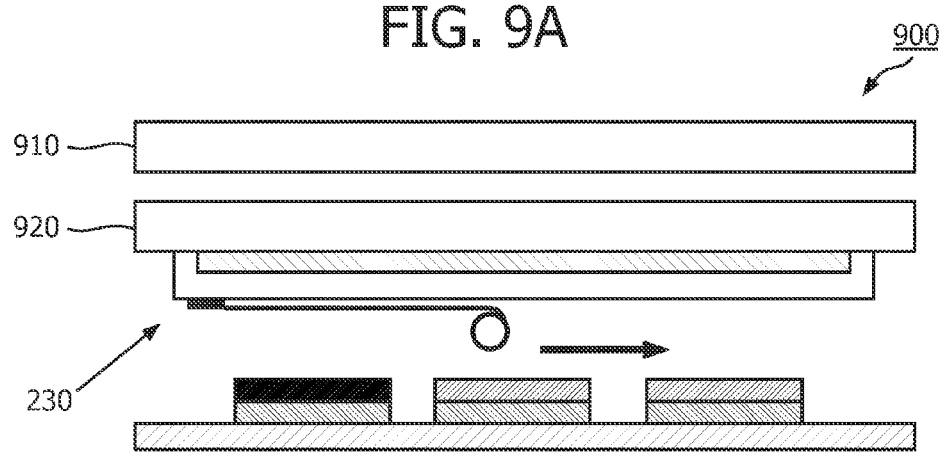
Figure 9C:
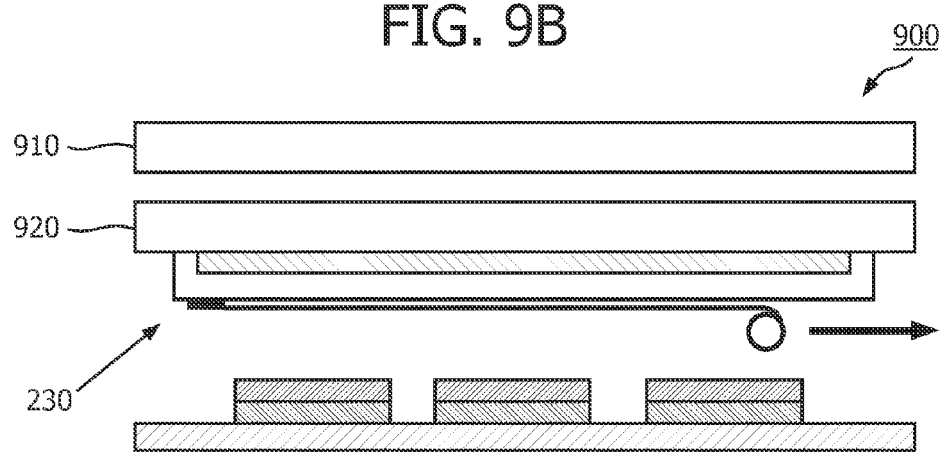

FIGS. 9A-C illustrate a seventh embodiment of an electronic device 900 including a cooling device with a rollable electrode.

Electronic device 900 is similar in construction and operation to electronic device 800, and only differences therebetween will be described.

In electronic device, the cooling device and the second substrate 920 are optically transparent. For instance transparent electrode materials, such as indium tin oxide (ITO and transparent substrates materials may be used. Such a configuration might be advantageous for cooling of heat-generating components used in optical applications, e.g. cooling of LEDs, OLEDs or laser diodes. When used for LEDs, in some embodiments an additional diffuser 910 may be positioned on top of second substrate 920 in order to homogenize the LED light.

Figure 10A:
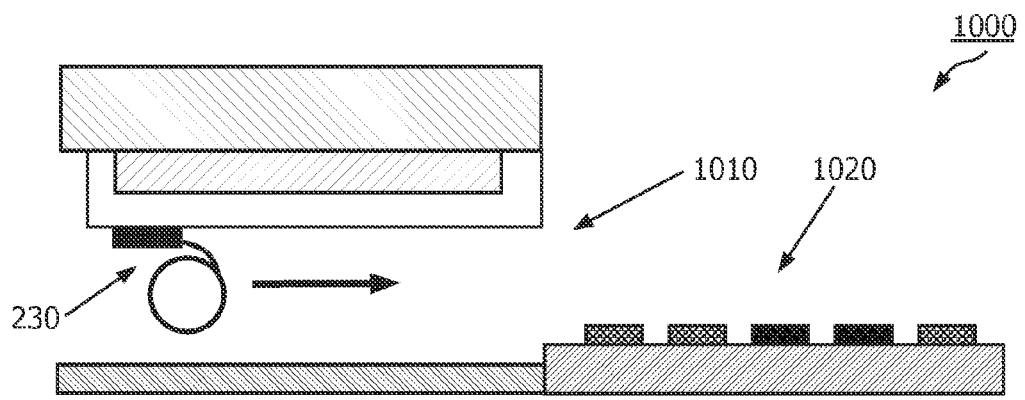
FIGS. 10A-C illustrate an eighth embodiment of an electronic device including a cooling device with an electro-statically movable electrode, in particular a rollable electrode.
Figure 10B:
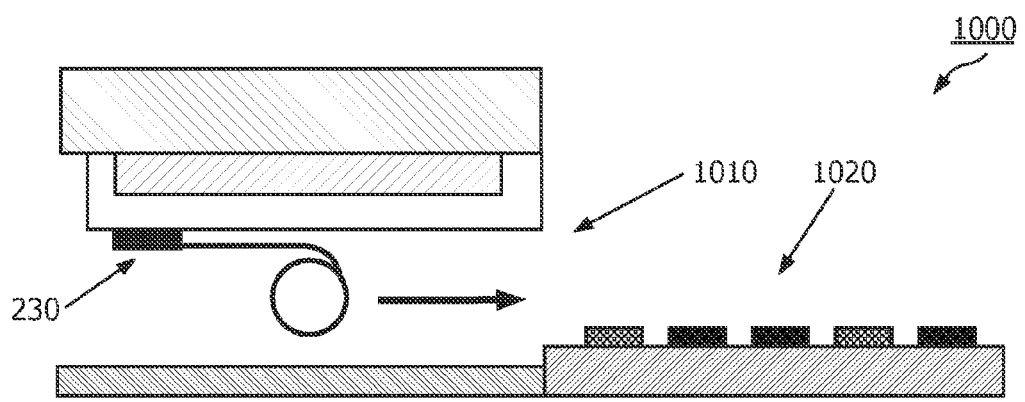
Figure 10C:
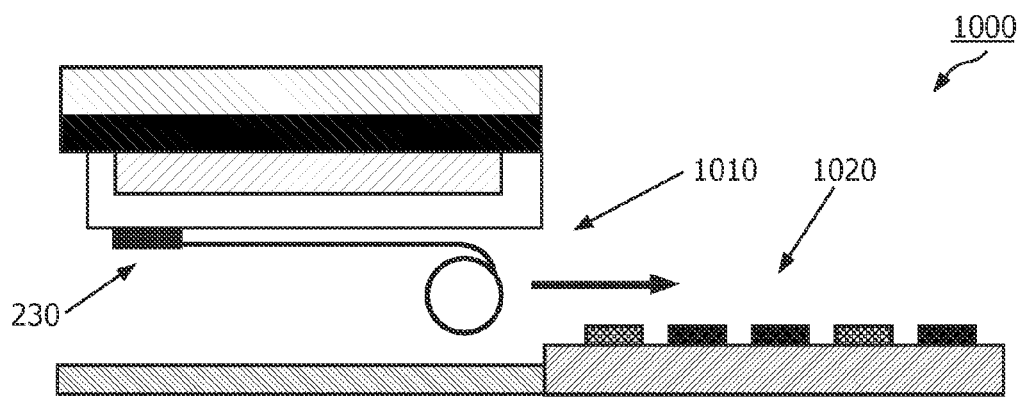

FIGS. 10A-C illustrate an eighth embodiment of an electronic device 1000 including a cooling device with a rollable electrode.

In device 1000, the one or more heat-generating elements 1020 are provided at a first side of a first substrate, and cooling device 230 is provided inside a tubular structure 1010 disposed laterally adjacent to the first substrate and heat-generating elements 1020. Tubular structure 1010 has a first end proximate the first substrate and the one or more heat-generating elements 1020, and a second end laterally displaced with respect to the first end, wherein the first end and the second end are open. In some embodiments, tubular structure 1010 may have a square or rectangular shaped cross section. The second electrode of cooling device 230 is configured to influence a fluid to flow at least in part through the tubular structure between the first and second ends and over heat-generating elements 1020 to provide cooling to heat-generating elements 1020.

Figure 11:
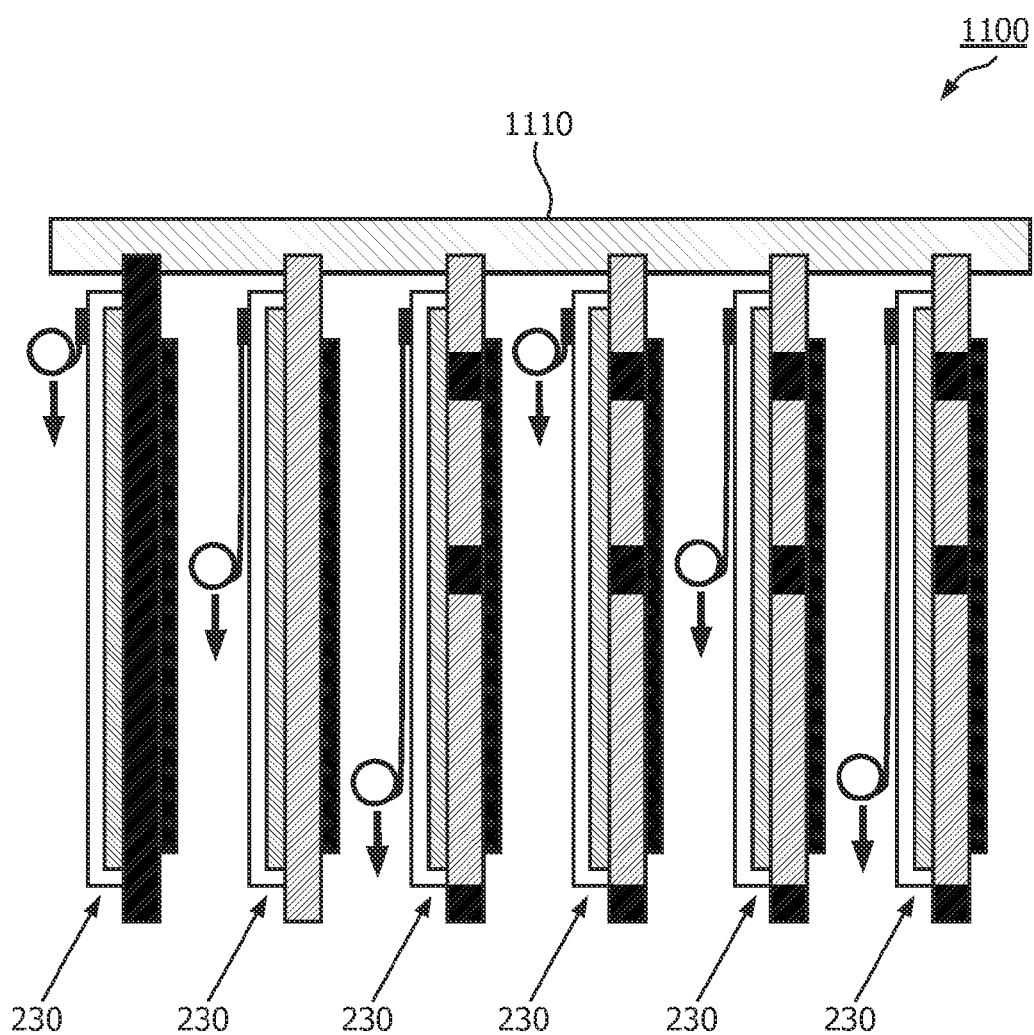
FIG. 11 illustrates a ninth embodiment of an electronic device including a cooling device with an electro-statically movable electrode, in particular a rollable electrode.
Figure 12A:
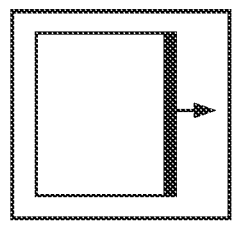
FIGS. 12A-E are plan views showing various embodiments of different shapes and configurations of rollable electrodes.
Figure 12B:
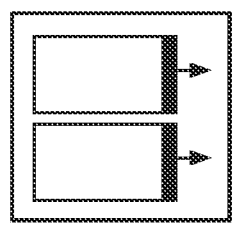
Figure 12C:
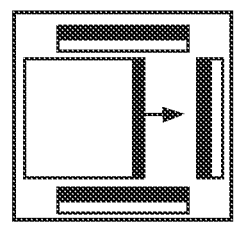
Figure 12D:
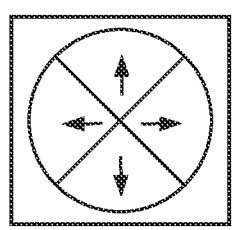
Figure 12E:
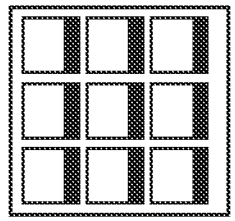

FIG. 11 illustrates a ninth embodiment of an electronic device 1100 including a cooling device with a rollable electrode. In particular, electronic device 1100 includes a plurality of cards provided in various card slots of a structure 1110, where each card is provided with a cooling device 230 as described above.

FIGS. 12A-E are plan views showing various embodiments of different shapes and configurations of rollable electrodes.

Figure 13A:
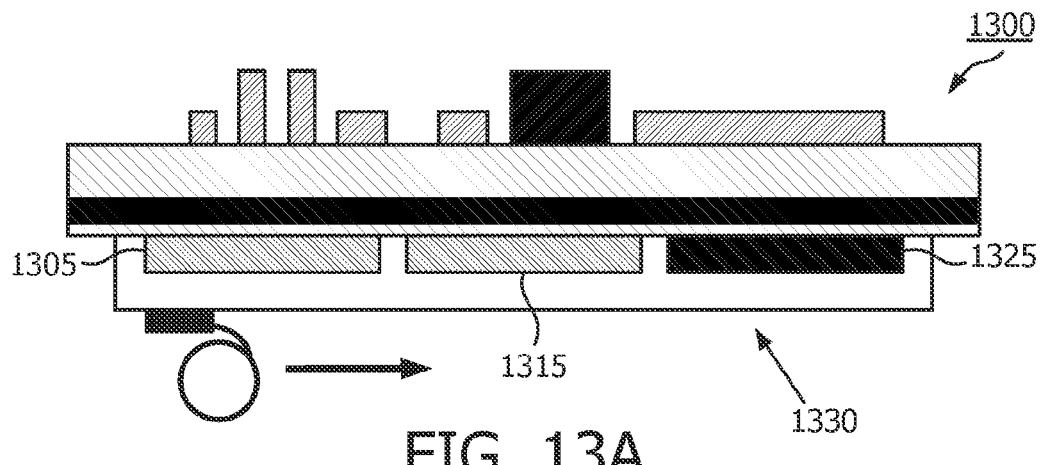
FIGS. 13A-C illustrate a tenth embodiment of an electronic device including a cooling device with a rollable electrode.
Figure 13B:
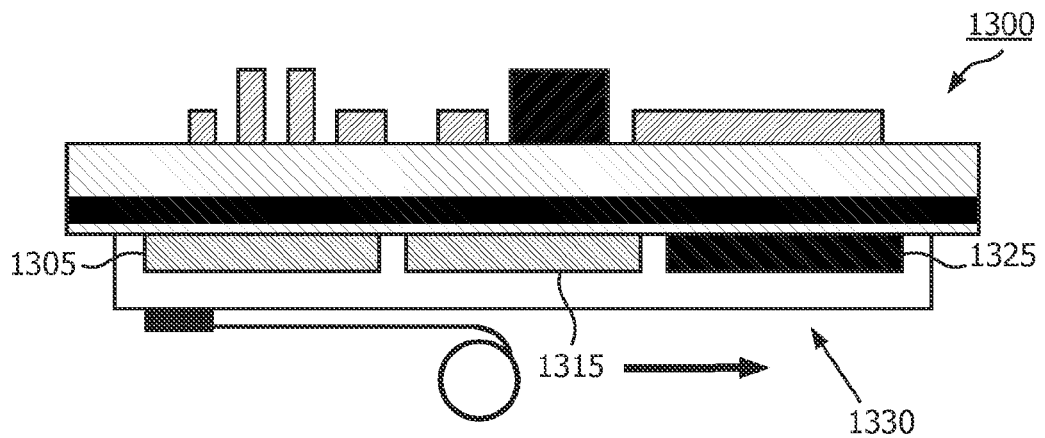
Figure 13C:
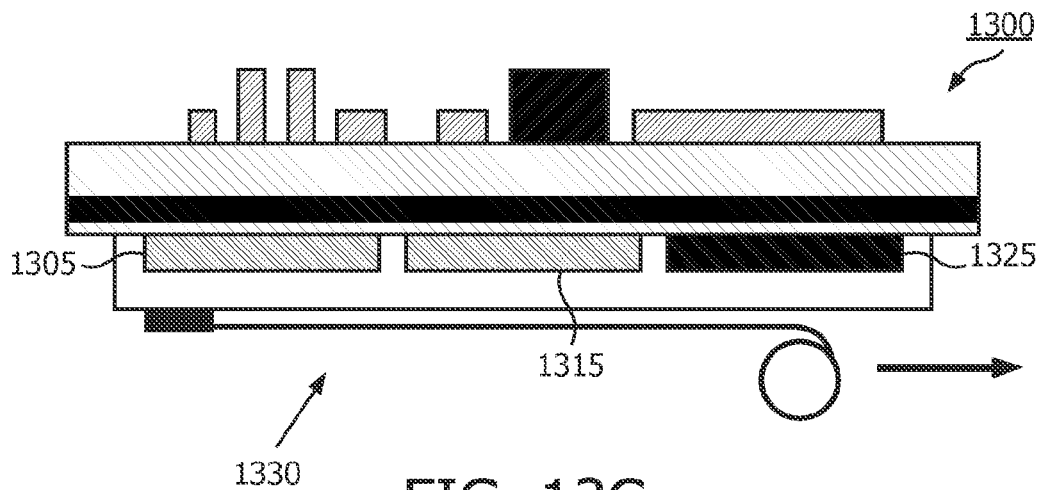

FIGS. 13A-C illustrate a tenth embodiment of an electronic device 1300 including a cooling device with a rollable electrode.

Electronic device 1300 is similar in construction and operation to electronic device 300, and only differences therebetween will be described.

In electronic device 1300, cooling device 1330 includes first, third and fourth electrodes 1305, 1315 and 1325, wherein the electrically insulating layer is disposed between the second electrode and third electrode 1315, and between the second electrode and fourth electrode 1325. In a beneficial arrangement, first, third, and fourth electrodes 1305, 1315 and 1325 are connected to different electrical potentials from each other. This feature may allow advanced control and switching of the movement of the rollable second electrode.

Figure 14A:
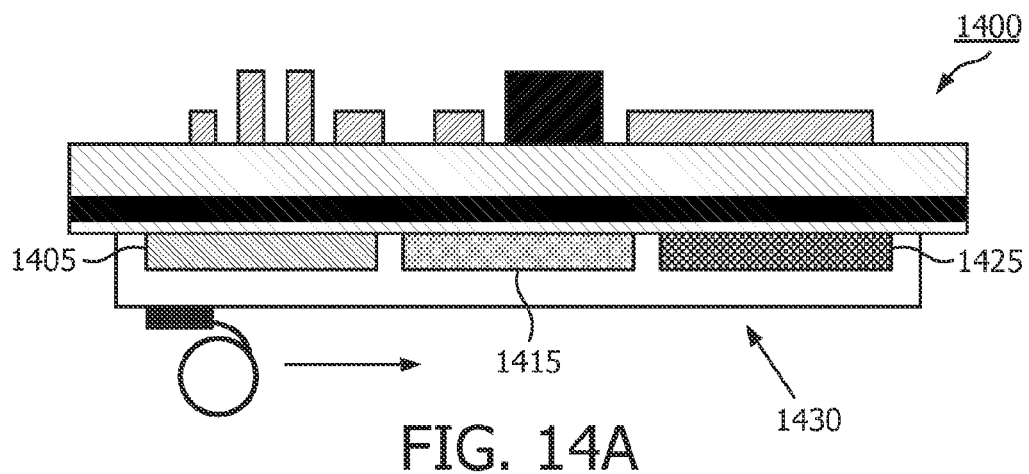
FIGS. 14A-C illustrate an eleventh embodiment of an electronic device including a cooling device with an electro-statically movable electrode, in particular a rollable electrode.
Figure 14B:
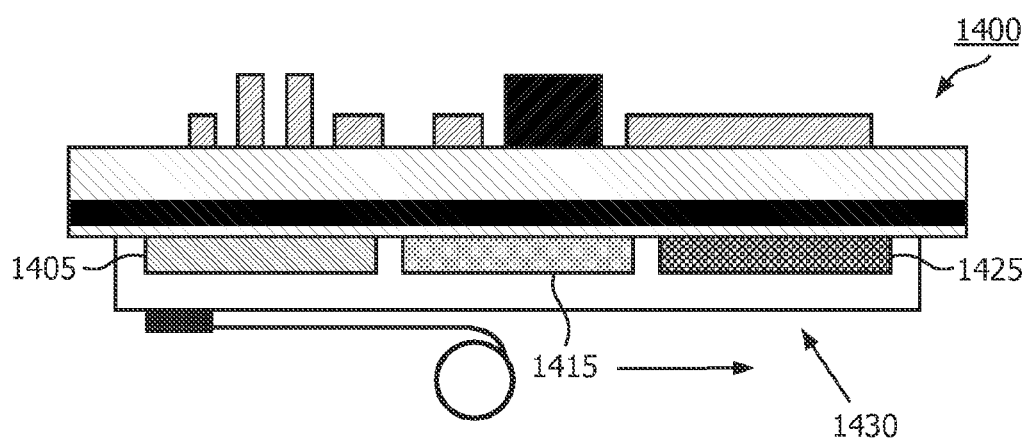
Figure 14C:
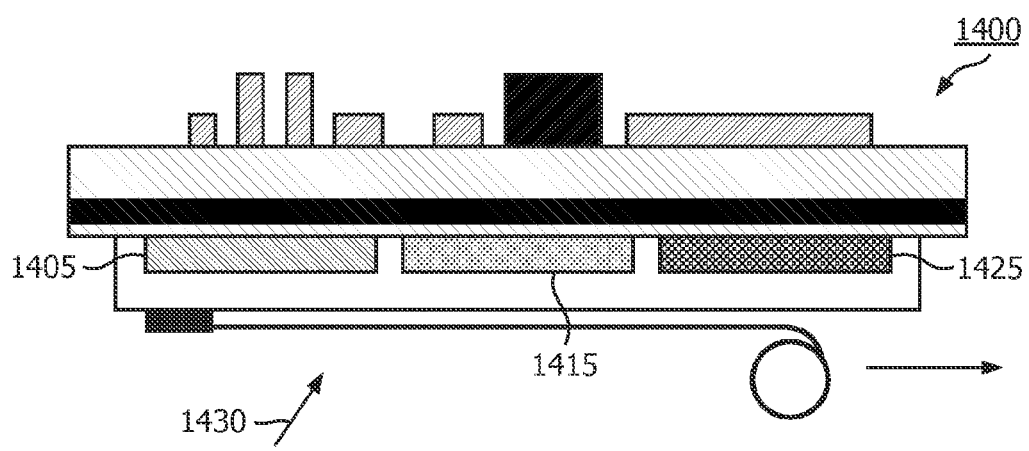

FIGS. 14A-C illustrate an eleventh embodiment of an electronic device 1400 including a cooling device with a rollable electrode.

Electronic device 1400 is similar in construction and operation to electronic device 300, and only differences therebetween will be described.

In electronic device 1400, the first electrode of cooling device 1430 has a gradient in conductivity/resistance along its length from section 1405, through section 1415, to section 1425 along the direction in which the second electrode is rolled and unrolled. This feature may allow advanced control and switching of the movement of the rollable second electrode.

Figure 15A:
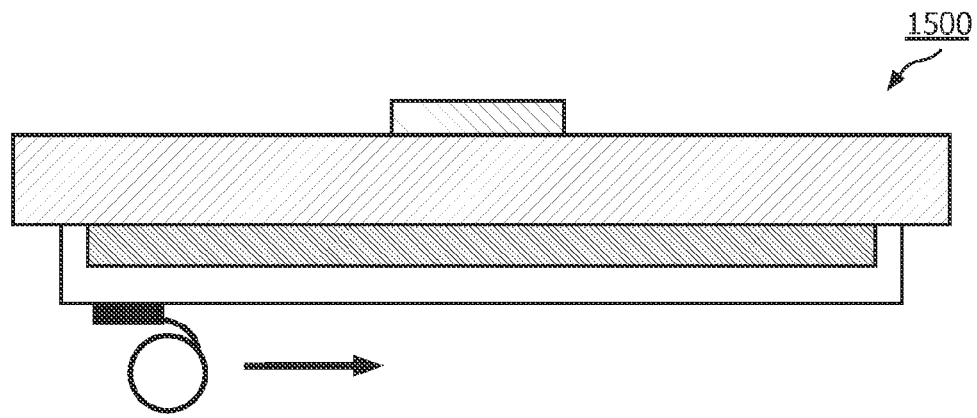
FIGS. 15A-C illustrate a twelfth embodiment of an electronic device including a cooling device with an electro-statically movable electrode, in particular a rollable electrode.
Figure 15B:
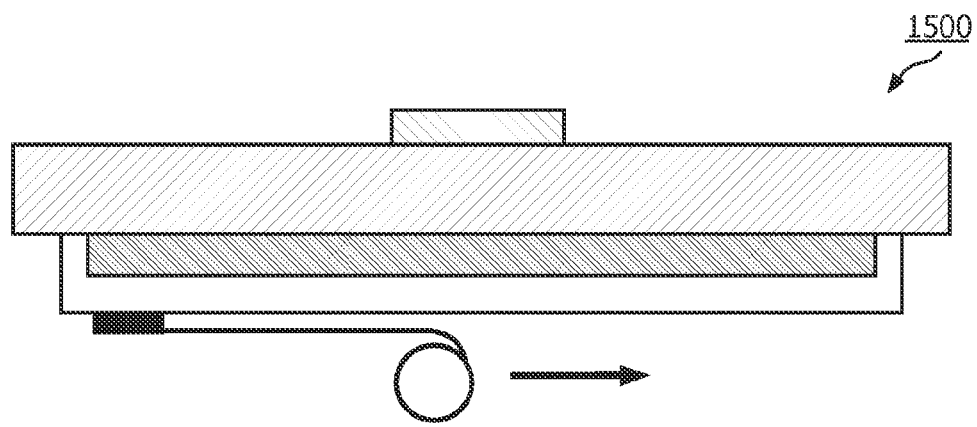
Figure 15C:
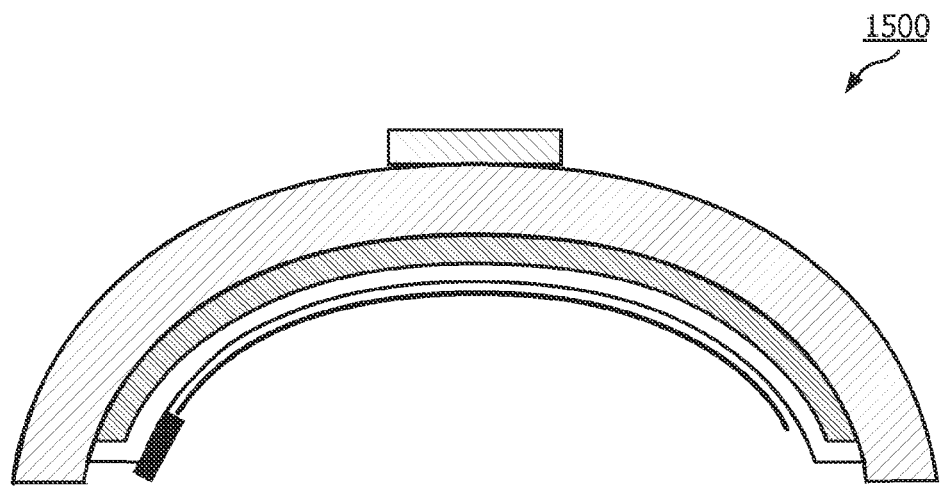

FIGS. 15A-C illustrate a twelfth embodiment of an electronic device 1500 including a cooling device with a rollable electrode.

In particular, FIGS. 15A-C illustrate an electronic device 1500 wherein the cooling device is constructed using flexible materials and can therefore be used in flexible and/or curved applications.

Figure 16:
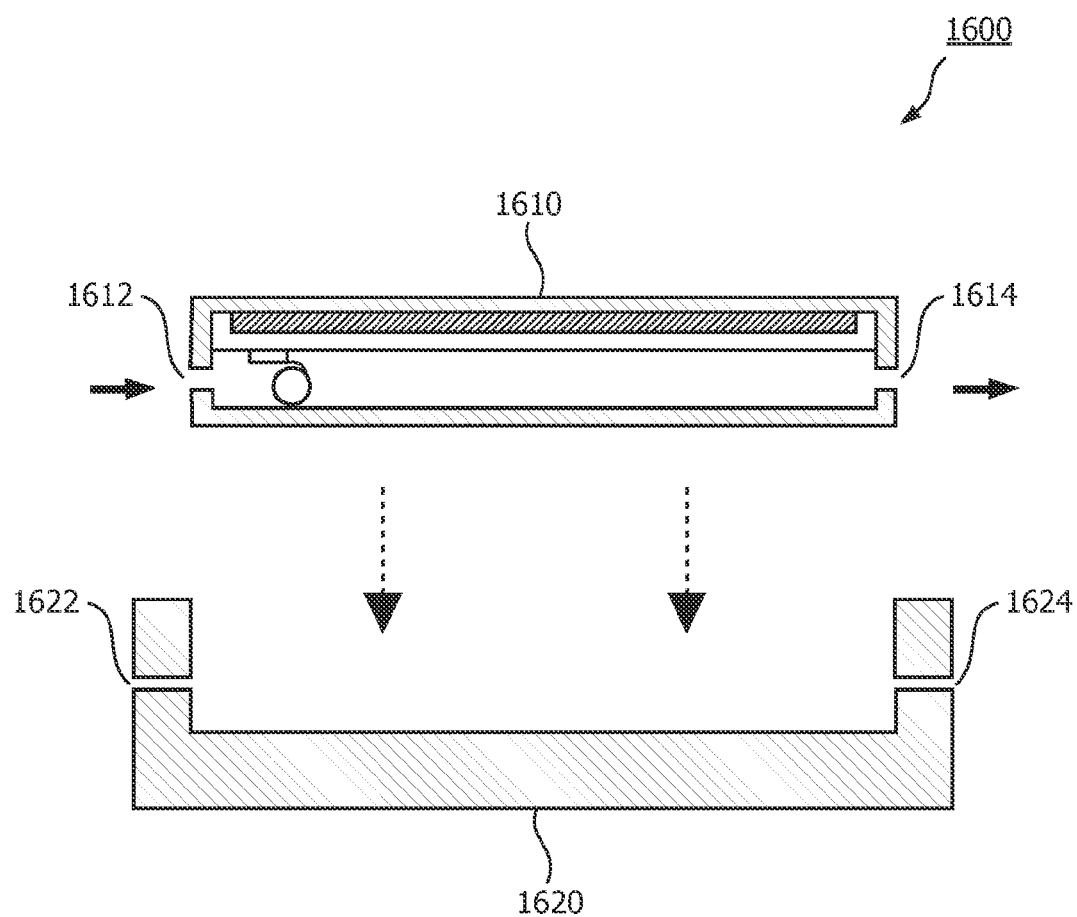
FIG. 16 illustrates a thirteenth embodiment of an electronic device including a cooling device with an electro-statically movable electrode, in particular a rollable electrode.

FIG. 16 illustrates a thirteenth embodiment of an electronic device 1600 including a cooling device with a rollable electrode.

In electronic device 1600, a cooling device (e.g., cooling device 230) is provided in a cartridge 1610 having a fluid inlet 1612 and a fluid outlet 1614 at opposite ends thereof.

Electronic device 1600 also includes a structure 1620 having a cavity therein such that cartridge 1610 may be removably inserted therein. Structure 1620 also includes a fluid inlet 1622 and a fluid outlet 1624 at opposite ends of the cavity which match fluid inlet 1612 and fluid outlet 1614 of cartridge 1610.

One or more heat-generating elements may be associated with structure 1620 such that cartridge 1610 may remove heat or provide cooling to the one or more heat-generating elements.

Figure 17A:
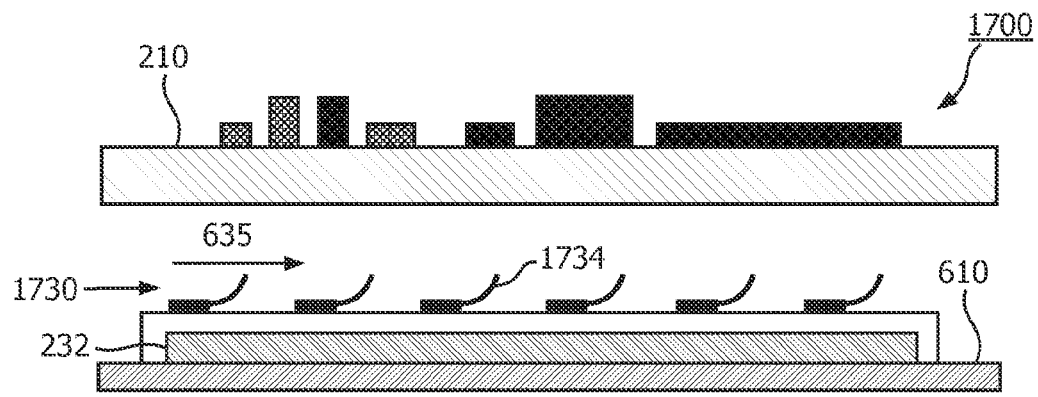
FIGS. 17A-C illustrates a thirteenth embodiment of an electronic device including a cooling device with an electro-statically movable electrode.
Figure 17B:
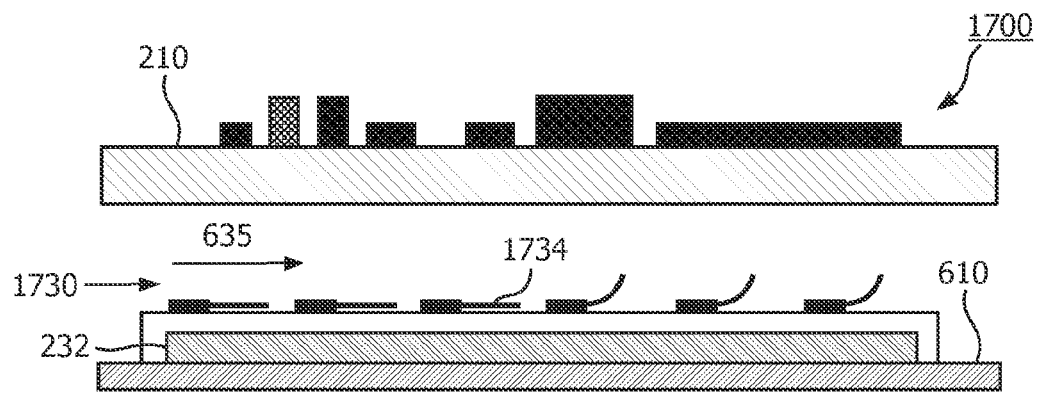
Figure 17C:
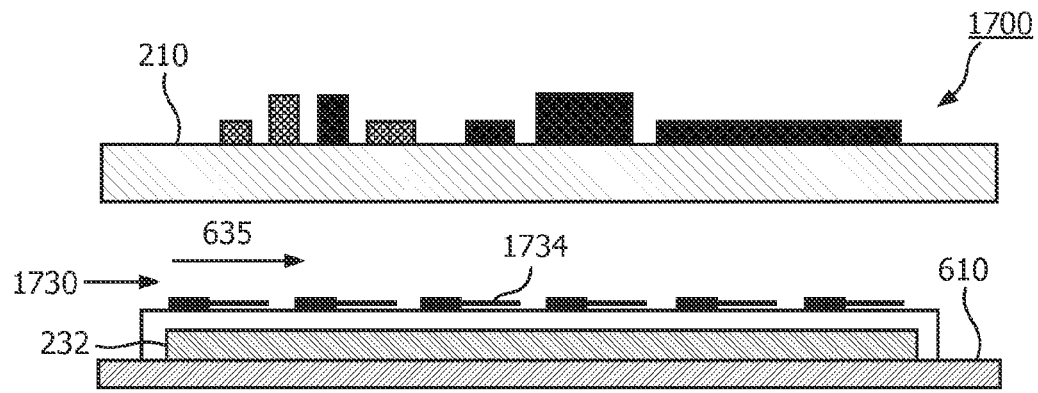

FIGS. 17A-C illustrates a fourteenth embodiment of an electronic device 1700 including a cooling device with an electro-statically movable electrode.

Electronic device 1700 is similar in construction and operation to electronic device 600, and only differences therebetween will be described.

A first difference between electronic device 1700 and electronic device 600 is that electronic device 1700 includes a cooling device 1730 provided on the second substrate 610. Furthermore, cooling device 1730 includes a plurality of electro-statically movable second electrodes, in particular a plurality of bendable second electrodes 1734. For example, each of the bendable second electrodes 1734 may be substantially shorter in length than the rollable second electrode 234 of electronic device 600. In that case, instead of second electrode 1734 rolling and unrolling in response to different voltages applied across or between first electrode 232 and second electrode 1734, second electrode 1734 may bend and straighten in response to different voltages applied across or between first electrode 232 and second electrode 1734.

In particular, FIG. 17A illustrates a situation where the second electrodes 1734 all have a first geometric shape or configuration, and in particular are in a bent state, where no potential difference is applied between first electrode 232 and the second electrodes 1734. FIG. 17B illustrates a situation where some of the second electrodes 1734 have a second geometric shape or configuration, and in particular are in a straight state in response to a sufficient potential difference being applied between first electrode 232 and the straightened second electrodes 1734. Finally, FIG. 17C illustrates a situation where some of the second electrodes 1734 have a second geometric shape or configuration, and in particular are in a straight state in response to a sufficient potential difference being applied between first electrode 232 and the straightened second electrodes 1734. By transitioning repeating between the states shown in FIGS. 17A-C, for example in response to a time-varying voltage applied from a controller such as controller 240, the bendable second electrodes can cause or influence a flow of a fluid 1735 which cools heat-generating devices on substrate 210.

It should be appreciated that cooling devices which employ bendable second electrodes as shown in FIGS. 17A-C may be employed in place of the rollable electrodes in some of the other embodiments described above, for example with respect to FIGS. 2A-C, 3A-C, 6A-C, 7A-C, 8A-C, 9A-C, 10A-C, 11, 13A-C, 14A-C, 15A-C and 16.

Figure 18A:
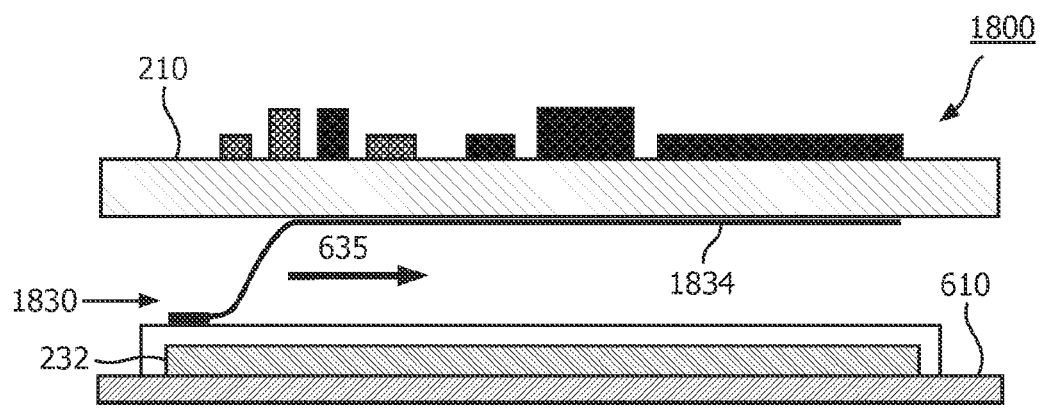
FIGS. 18A-C illustrates a thirteenth embodiment of an electronic device including a cooling device with an electro-statically movable electrode.
Figure 18B:
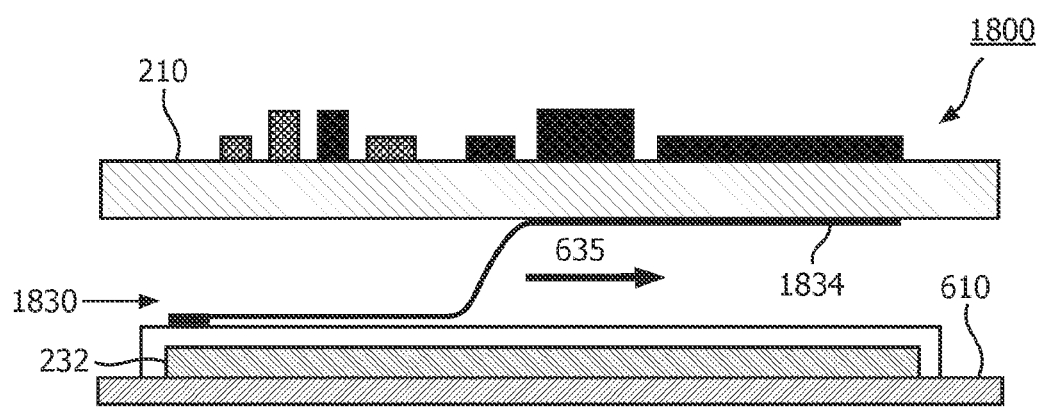
Figure 18C:
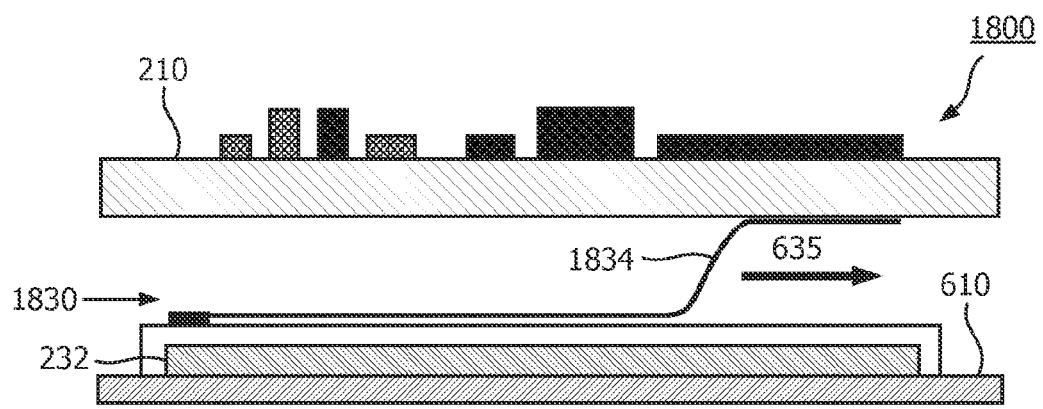

FIGS. 18A-C illustrates a fifteenth embodiment of an electronic device 1800 including a cooling device with an electro-statically movable electrode.

Electronic device 1800 is similar in construction and operation to electronic device 1700, and only differences therebetween will be described.

In electronic device 1800, the second electrode 1834 of cooling device 1830 has a generalized rolling or oscillating configuration. In particular, second electrode 1834 includes: a first portion in contact with a back side of first substrate 210, and a second portion in contact with the insulating layer on second substrate 610, and an "s-shaped" transition between the first and second portions, where the sizes of the two portions change as illustrated in FIGS. 18A-C in response to a voltage applied across or between second electrode 1834 and first electrode 232, for example in response to a time-varying voltage applied from a controller such as controller 240. As the sizes of the first and second portions change, the position of the "s-shaped" transition also moves laterally along the length of second electrode 1834, thereby causing or influencing a flow of a fluid 1835 which cools heat-generating devices on substrate 210. Such an electrode is defined herein as a "rolling wave electrode."

It should be appreciated that cooling devices which employ a rolling wave electrode as shown in FIGS. 18A-C may be employed in place of the rollable electrodes in some of the other embodiments described above, for example with respect to FIGS. 6A-C, 11 and 16.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Reference numerals appearing in the claims between parentheses, if any, are provided merely for convenience and should not be construed as limiting in any way.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The invention claimed is:

1. A lighting unit, comprising:
    at least one solid state light source;
    a cooling device configured to remove heat from the at least one solid state light source, the cooling device including:
        a first electrode,
        an electro-statically movable second electrode, and
        an electrically insulating layer disposed between the first and second electrodes,
        wherein the electro-statically movable second electrode is configured to have a first geometric configuration in response to a first electrical potential between the first and second electrodes, and is further configured to have a second geometric configuration in response to a second electrical potential between the first and second electrodes,
    a controller configured to apply a time-varying voltage to the cooling device that causes the electro-statically movable second electrode to repeatedly transition between the first and second geometric configurations to influence a flow of a fluid which cools the at least one solid state light source.

2. The lighting unit of claim 1, further comprising a substrate, wherein the at least one solid state light source is provided at a first side of the substrate, and wherein the cooling device is provided at a second side of the substrate.

3. The lighting unit of claim 1, wherein the cooling device further comprises a third electrode, wherein the electrically insulating layer is disposed between the first electrode and the third electrode, and wherein the controller is further configured to apply a second a time-varying voltage to the cooling device that causes the third electrode to repeatedly transition between the first and second geometric configurations such that the second and third electrodes work together to influence the flow of the fluid which cools the at least one solid state light source.

4. The lighting unit of claim 1, further comprising:
a first substrate, wherein the at least one solid state light source is provided at a first side of the substrate, and wherein the cooling device is provided at a second side of the substrate; and
a second substrate substantially parallel to the first substrate, wherein the fluid is disposed between the first substrate and the second substrate, and wherein the second electrode is configured to influence the fluid to flow in a direction parallel to the first and second substrates in response to the time-varying voltage.

5. The lighting unit of claim 1, further comprising:
a first substrate, wherein the at least one solid state light source is provided at a first side of the substrate, and wherein the cooling device is provided at a second side of the substrate;
a second substrate substantially parallel to the first substrate, wherein the fluid is disposed between the first and second substrates; and
a second cooling device provided at a side of the second substrate that is closest to the first substrate, including:
a third electrode,
a fourth electrode, and
a second electrically insulating layer disposed between the third and fourth electrodes,
wherein the fourth electrode is configured to have the first geometric configuration in response to a third electrical potential between the third and fourth electrodes, and is further configured to have the second geometric configuration in response to a fourth electrical potential between the third and fourth electrodes, and
wherein the controller is configured to apply a second time-varying voltage to the second cooling device that causes the fourth electrode to repeatedly transition between the first and second geometric configurations to influence the fluid to flow between the first and second substrates.

6. The lighting unit of claim 1, further comprising:
a first substrate, wherein the at least one solid state light source is provided at a first side of the first substrate; and
a second substrate substantially parallel to the first substrate, wherein the fluid is disposed between the first and second substrates,
wherein the cooling device is provided at a first side of the second substrate that is closest to the first substrate, and
wherein the second electrode is configured to influence the fluid to flow in a direction parallel to the first and second substrates in response to the time-varying voltage.

7. The lighting unit of claim 6, wherein the second substrate, the first electrode, the second electrode, and the electrically insulating layer are all substantially transparent, and wherein the lighting unit further comprises a diffuser provided at a second side of the second substrate.

8. The lighting unit of claim 1, wherein the at least one solid state light source is provided at a first side of a substrate, and wherein the cooling device is provided inside a tubular structure having a first end proximate the substrate and the at least one solid state light source, and wherein the second electrode is configured to influence the fluid to flow at least in part through the tubular structure.

9. The lighting unit of claim 1, further comprising third and fourth electrodes, wherein the electrically insulating layer is disposed between the first electrode and the third electrode and between the first electrode and the fourth electrode, and wherein the second, third, and fourth electrodes are connected to different electrical potentials than each other.

10. The lighting unit of claim 1, wherein the first electrode has a gradient in conductivity between a first end and a second end thereof.

11. The lighting unit of claim 1, further comprising:
a structure on which the at least one solid state light source is provided, wherein the structure includes a cavity; and
a cartridge having a fluid inlet and a fluid outlet,
wherein the cooling device is disposed within the cartridge, and
wherein the cartridge is configured to be removably inserted in the cavity of the structure.

12. The lighting unit of claim 1, wherein the at least one solid state light source comprises at least one light emitting diode or laser diode.

13. The lighting unit of claim 1, wherein the second electrode is a rollable electrode and is configured to be in a rolled-up state in response to the first electrical potential between the first and second electrodes, and is further configured to be unrolled into an unrolled state in response to the second electrical potential between the first and second electrodes, and wherein the time-varying voltage causes the second electrode to repeatedly transition between the rolled-up state and the unrolled state.

14. The lighting unit of claim 1, wherein the second electrode is a bendable electrode and is configured to be in a bent state in response to the first electrical potential between the first and second electrodes, and is further configured to be moved into a straightened state in response to the second electrical potential between the first and second electrodes, and wherein the time-varying voltage causes the second electrode to repeatedly transition between the bent state and the straightened state.

15. The lighting unit of claim 1, further comprising:
a first substrate, wherein the at least one solid state light source is provided at a first side of the substrate, and wherein the cooling device is provided at a second side of the substrate; and
a second substrate substantially parallel to the first substrate and disposed at the second side of the first substrate,
wherein the fluid is disposed between the first substrate and the second substrate,
wherein the cooling device is disposed on a first side of the second substrate that is located closest to the first substrate, and
wherein the electro-statically movable second electrode is a rolling wave electrode.

16. The lighting unit of claim 1, wherein the cooling device further comprises:
a third electrode;
an electro-statically movable fourth electrode; and
a second electrically insulating layer disposed between the third and fourth electrodes, wherein the electro-statically movable fourth electrode is configured to have the first geometric configuration in response to a third electrical potential between the third and fourth electrodes, and is further configured to have the second geometric configuration in response to a fourth electrical potential between the third and fourth electrodes, and wherein the controller is configured to apply a second time-varying voltage to the cooling device that causes the electro-statically movable fourth electrode to repeatedly transition between the first and second geometric configurations to influence the flow of the fluid which cools the at least one solid state light source.

17. A method, comprising:
providing a cooling device in a vicinity of at least one heat-generating element, the cooling device including:
a first electrode,
a second electrode, and
an electrically insulating layer disposed between the first and second electrodes, wherein the second electrode is biased to have a first geometric configuration, and configured to transition to a second geometric configuration in response to an electrical potential applied between the first and second electrodes; and
applying a time-varying voltage to the cooling device that causes the second electrode to repeatedly transition between the first geometric configuration and the second geometric configuration to influence a flow of a fluid which cools the at least one heat-generating element.

18. The method of claim 17, wherein applying the time-varying voltage comprises applying a periodic voltage.

19. The method of claim 17, wherein the second electrode is a rollable electrode and is biased to remain in a rolled-up state, and is further configured to be unrolled into an unrolled state in response to the electrical potential applied between the first and second electrodes.

20. The method of claim 17, wherein the second electrode is a bendable electrode and is biased to remain in a bent state in response to the first electrical potential between the first and second electrodes, and is further configured to be moved into a straightened state in response to the electrical potential applied between the first and second electrodes.

21. The method of claim 17, wherein the second electrode is a rolling wave electrode.

22. A device, comprising:
a first electrode;
an electro-statically movable second electrode; and
an electrically insulating layer disposed between the first and second electrodes, wherein the electro-statically movable second electrode is configured to have a first geometric configuration in response to a first electrical potential between the first and second electrodes, and is further configured to have a second geometric configuration in response to a second electrical potential between the first and second electrodes, and
wherein the device is configured to receive a time-varying voltage and in response thereto the electro-statically movable second electrode is configured to repeatedly transition between the first geometric configuration and the second geometric configuration to influence a flow of a fluid in a direction substantially parallel to the first electrode for cooling at least one heat-generating element.

23. The device of claim 22, further comprising an electro-statically movable third electrode,
wherein the electrically insulating layer is disposed between the first electrode and the third electrode,
wherein the electro-statically movable third electrode is configured to have the first geometric configuration in response to a third electrical potential between the first and third electrodes, and is further configured to have the second geometric configuration in response to a fourth electrical potential between the first and third electrodes, and wherein the device is configured to receive a second time-varying and in response thereto the third electrode is configured to repeatedly transition between the first geometric configuration and the second geometric configuration such that the second and third electrodes work together to influence the flow of the fluid for cooling the at least one heat-generating element.

24. The device of claim 22, further comprising:
a first substrate, wherein the first electrode, electrically insulating layer, and the electro-statically movable second electrode are provided at a first side of the substrate; and
a second substrate substantially parallel to the first substrate and disposed at the first side of the first substrate, wherein the fluid is disposed between the first substrate and the second substrate, and wherein the second electrode is configured to influence the fluid to flow in a direction parallel to the first and second substrates in response to the time-varying voltage.

25. The device of claim 22, further comprising:
a first substrate, wherein the first electrode, electrically insulating layer, and the electro-statically movable second electrode are provided at a first side of the substrate;
a second substrate substantially parallel to the first substrate and disposed at the first side of the first substrate, wherein the fluid is disposed between the first and second substrates;
a third electrode;
an electro-statically movable fourth electrode; and
a second electrically insulating layer disposed between the third and fourth electrodes,
wherein the third electrode, second electrically insulating layer, and the electro-statically movable fourth electrode are provided at a first side of the second substrate that is closest to the first substrate,
wherein the fourth electrode is configured to have a first geometric configuration in response to a third electrical potential between the third and fourth electrodes, and is further configured to have the second geometric configuration in response to a fourth electrical potential between the third and fourth electrodes, and
wherein the device is configured to receive a second time-varying and in response thereto the electro-statically movable fourth electrode is configured to repeatedly transition between the first geometric configuration and the second geometric configuration such that the second and fourth electrodes work together to influence the fluid to flow in a direction parallel to the first and second substrates.

26. The device of claim 22, further comprising third and fourth electrodes, wherein the electrically insulating layer is disposed between the first electrode and the third electrode and between the first electrode and the fourth electrode.

27. The device of claim 22, further comprising:
a cartridge having a fluid inlet and a fluid outlet,
wherein the first electrode, electro-statically movable second electrode, and electrically insulating layer are disposed within the cartridge, and
wherein the cartridge is configured to be removably inserted in a cavity of a structure.

28. The device of claim 22, wherein the electro-statically movable second electrode is a rollable electrode.

29. The device of claim 22, wherein the electro-statically movable second electrode is a bendable electrode.

30. The device of claim 22, wherein the electro-statically movable second electrode is a rolling wave electrode.

* * * * *